United States Patent
Endo et al.

(10) Patent No.: US 12,344,758 B2
(45) Date of Patent: Jul. 1, 2025

(54) CHEMICAL SOLUTION-RESISTANT PROTECTIVE FILM FORMING COMPOSITION CONTAINING POLYMERIZATION PRODUCT HAVING DIOL STRUCTURE AT TERMINAL THEREOF

(71) Applicant: NISSAN CHEMICAL CORPORATION, Tokyo (JP)

(72) Inventors: Takafumi Endo, Toyama (JP); Tokio Nishita, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 907 days.

(21) Appl. No.: 17/433,523

(22) PCT Filed: Mar. 3, 2020

(86) PCT No.: PCT/JP2020/008784
§ 371 (c)(1),
(2) Date: Aug. 24, 2021

(87) PCT Pub. No.: WO2020/179757
PCT Pub. Date: Sep. 10, 2020

(65) Prior Publication Data
US 2022/0145119 A1    May 12, 2022

(30) Foreign Application Priority Data
Mar. 4, 2019  (JP) ................. 2019-038936

(51) Int. Cl.
| | | |
|---|---|---|
| *C09D 163/00* | (2006.01) |
| *C08G 59/14* | (2006.01) |
| *C08G 59/24* | (2006.01) |
| *C08G 59/26* | (2006.01) |
| *C08G 59/42* | (2006.01) |
| *C08G 59/66* | (2006.01) |
| *C09D 5/00* | (2006.01) |
| *G03F 7/09* | (2006.01) |
| *G03F 7/11* | (2006.01) |
| *G03F 7/26* | (2006.01) |
| *H01L 21/027* | (2006.01) |
| *H01L 21/306* | (2006.01) |
| *H01L 21/308* | (2006.01) |
| *H01L 21/311* | (2006.01) |
| *H01L 21/3213* | (2006.01) |

(52) U.S. Cl.
CPC ......... *C09D 163/00* (2013.01); *C08G 59/245* (2013.01); *C08G 59/26* (2013.01); *C08G 59/4207* (2013.01); *C08G 59/423* (2013.01); *C08G 59/4284* (2013.01); *C08G 59/66* (2013.01); *C09D 5/002* (2013.01); *G03F 7/11* (2013.01); *H01L 21/30604* (2013.01); *H01L 21/3081* (2013.01); *H01L 21/31111* (2013.01); *H01L 21/31138* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 4,072,523 A | * | 2/1978 | Pollet | C07C 323/25 |
| | | | | 430/435 |
| 2009/0317740 A1 | * | 12/2009 | Hiroi | G03F 7/11 |
| | | | | 430/311 |
| 2018/0284614 A1 | * | 10/2018 | Satoh | G03F 7/322 |

FOREIGN PATENT DOCUMENTS

| | | | |
|---|---|---|---|
| CN | 108341948 A | * | 7/2018 |
| JP | 2015-038534 A | | 2/2015 |
| WO | 2007/148627 A1 | | 12/2007 |
| WO | 2009/104685 A1 | | 8/2009 |
| WO | 2018052130 A1 | | 3/2018 |
| WO | 2018/203540 A1 | | 11/2018 |

OTHER PUBLICATIONS

May 26, 2020 International Search Report issued in International Patent Application No. PCT/JP2020/008784.
Aug. 25, 2021 International Preliminary Report on Patentability Issued in International Patent Application No. PCT/JP2020/008784.

* cited by examiner

*Primary Examiner* — Ha S Nguyen
(74) *Attorney, Agent, or Firm* — Oliff PLC

(57) ABSTRACT

A protective film forming composition which has good mask (protection) function against a wet etching liquid and a high dry etching rate during processing of a semiconductor substrate and also has good coverage even in a stepped substrate, and from which a flat film can be formed due to a small difference in film thickness after being embedded; a protective film produced using said composition; a substrate with a resist pattern; and a method for manufacturing a semiconductor device. This protective film forming composition against a wet etching liquid for semiconductors contains an organic solvent and a polymer having, at a terminal thereof, a structure containing at least one pair of two adjacent hydroxyl groups in a molecule. The structure containing two adjacent hydroxyl groups in a molecule may be 1,2-ethanediol structure (A).

21 Claims, No Drawings

CHEMICAL SOLUTION-RESISTANT PROTECTIVE FILM FORMING COMPOSITION CONTAINING POLYMERIZATION PRODUCT HAVING DIOL STRUCTURE AT TERMINAL THEREOF

TECHNICAL FIELD

The present invention relates to a composition for forming a protective film excellent in resistance particularly against a wet etching liquid for a semiconductor, in a lithography process for manufacturing a semiconductor. In addition, the present invention relates to a manufacturing method of a substrate with a resist pattern and a manufacturing method of a semiconductor device, to which the protective film is applied.

BACKGROUND ART

In the manufacture of semiconductor, a lithography process comprising providing a resist underlayer film between a substrate and a resist film to be formed thereon and forming a resist pattern having a desired shape has been widely known. The substrate is processed after the formation of resist pattern. As a step thereof, dry etching has mostly been used; however, wet etching may also be used in accordance with the type of substrate. Patent Literature 1 discloses a composition for forming a protective film against a hydrogen peroxide aqueous solution, including a specific compound having a carboxy group and/or a hydroxy group.

CITATION LIST

Patent Literature

Patent Literature 1: WO 2018/052130 A

SUMMARY OF INVENTION

Technical Problem

In a case where a base substrate is processed by wet etching by using the resist underlayer film as an etching mask, the resist underlayer film is required to have an excellent mask function against a wet etching liquid at the time of processing the base substrate (that is, a masked portion is capable of protecting the substrate).

In such a case, the resist underlayer film is used as a protective film against the substrate. Further, in a case where the protective film, which is unnecessary after the wet etching, is removed by dry etching, the protective film is required to have a fast etching rate (a high etching rate) at which the protective film can be promptly removed by the dry etching such that the base substrate is not damaged.

Further, a composition for forming a protective film that has excellent coatability even against the so-called stepped substrate, provides a small film thickness difference after embedment, and is capable of forming a flat film has been also required.

In the related art, in order to exhibit resistance against SC-1 (an ammonia-hydrogen peroxide solution), which is one type of wet etching chemical solutions, a method of applying a low-molecular compound (for example, a gallic acid) as an additive was used; however, there was a limit for solving the problems described above.

An object of the present invention is to solve the problems described above.

Solution to Problem

The present invention includes the followings.

[1] A composition for forming a protective film against a wet etching liquid for a semiconductor, comprising:
   a polymer having at a terminal thereof a structure including at least one pair of two hydroxy groups adjacent to each other in the molecule; and
   an organic solvent.

[2] The composition for forming a protective film according to [1], wherein the structure including at least one pair of two hydroxy groups adjacent to each other in the molecule is a 1,2-ethanediol structure (A).

[3] The composition for forming a protective film according to [2], wherein the 1,2-ethanediol structure includes a structure represented by formula (1):

[Chemical Formula 1]

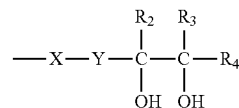

Formula (1)

(in formula (1), X represents any of —COO—, —OCO—, —O—, —S—, and —NR$_1$—; R$_1$ represents a hydrogen atom or a methyl group; Y represents a direct bond or an alkylene group having 1 to 4 carbon atoms which may be substituted; R$_2$, R$_3$, and R$_4$ each are a hydrogen atom, an alkyl group having 1 to 10 carbon atoms which may be substituted, or an aryl group having 6 to 40 carbon atoms which may be substituted; and R$_2$ may form a ring together with R$_3$ or R$_4$).

[4] The composition for forming a protective film according to [3], wherein in formula (1), R$_2$, R$_3$, and R$_4$ are a hydrogen atom.

[5] The composition for forming a protective film according to [3] or [4], wherein in formula (1), Y is a methylene group.

[6] The composition for forming a protective film according to any one of [3] to [5], wherein in formula (1), X is —S—.

[7] The composition for forming a protective film according to any one of [1] to [6], wherein the polymer is a reaction product of a diepoxy compound (B) and a bi- or higher-functional proton generating compound (C).

[8] The composition for forming a protective film according to [7], wherein the bi- or higher-functional proton generating compound (C) has at least one functional group selected from a hydroxy group, a carboxy group, a thiol group, an amino group, and an imide group.

[9] The composition for forming a protective film according to [7], wherein the bi- or higher-functional proton generating compound (C) is an acid dianhydride.

[10] The composition for forming a protective film according to any one of [1] to [9], wherein the polymer has a partial structure represented by formula (2) below:

[Chemical Formula 2]

Formula (2)

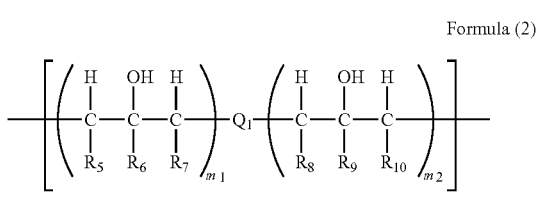

(in formula (2), $R_5$, $R_6$, $R_7$, $R_8$, $R_9$, and $R_{10}$ each independently represent a hydrogen atom, a methyl group, or an ethyl group; Q1 represents a divalent organic group between two carbon atoms; and m1 and m2 each independently represent 0 or 1).

[11] The composition for forming a protective film according to [10], wherein in formula (2) above, Q1 is represented by formula (3) below:

[Chemical Formula 3]

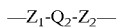   Formula (3)

(in formula (3), Q2 represents a direct bond, an alkylene group having 1 to 10 carbon atoms which may be interrupted with —O—, —S—, or —S—S—, an alkenylene group having 2 to 6 carbon atoms which may be interrupted with —O—, —S—, or —S—S—, or a divalent organic group having at least one of an alicyclic hydrocarbon ring having 3 to 10 carbon atoms and an aromatic hydrocarbon ring having 6 to 14 carbon atoms, the divalent organic group may be substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxy carbonyl group having 1 to 6 carbon atoms, and an alkyl thio group having 1 to 6 carbon atoms, and Z1 and Z2 each represent any of —COO—, —OCO—, —O—, and —S—).

[12] The composition for forming a protective film according to [10], wherein in formula (2) above, Q1 is represented by formula (4) below:

[Chemical Formula 4]

Formula (4)

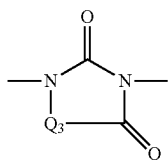

(in formula (4), Q3 represents formula (5), formula (6), or formula (7) below)

[Chemical Formula 5]

Formula (5)

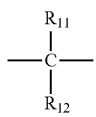

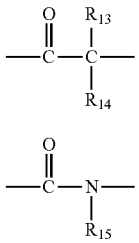

Formula (6)

Formula (7)

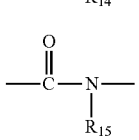

(in formula (5), formula (6), and formula (7), $R_{11}$, $R_{12}$, $R_{13}$, $R_{14}$, and $R_{15}$ each independently represent a hydrogen atom, an alkyl group having 1 to 6 carbon atoms, an alkenyl group having 3 to 6 carbon atoms, a benzyl group, or a phenyl group, the phenyl group may be substituted with at least one member selected from the group consisting of an alkyl group having 1 to 6 carbon atoms, a halogen atom, a nitro group, a cyano group, an alkoxy group having 1 to 6 carbon atoms, and an alkyl thio group having 1 to 6 carbon atoms, and $R_{13}$ and $R_{14}$ may be bonded to each other to form a ring having 3 to 6 carbon atoms).

[13] The composition for forming a protective film according to any one of [1] to [12], further comprising a cross-linking catalyst.

[14] The composition for forming a protective film according to any one of [1] to [13], further comprising a cross-linking agent.

[15] The composition for forming a protective film according to any one of [1] to [14], further comprising a surfactant.

[16] A protective film, which is a calcined product of a coating film from the composition for forming a protective film according to any one of [1] to [15].

[17] A method for producing a resist-patterned substrate for use in manufacturing of a semiconductor, comprising the steps of:

applying the protective film composition for forming a protective film according to any one of [1] to [15] onto a semiconductor substrate and baking the applied composition to form a protective film as a resist underlayer film;

forming a resist film on the protective film; and then, subjecting the semiconductor substrate to exposure and development to form a resist pattern.

[18] A method for manufacturing a semiconductor device, comprising the steps of:

forming a protective film on a semiconductor substrate, which may have an inorganic film formed on a surface thereof, with the composition for forming a protective film according to any one of [1] to [15];

forming a resist pattern on the protective film;

dry etching the protective film through the resist pattern as a mask so as to expose the inorganic film or a surface of the semiconductor substrate;

wet etching the inorganic film or the semiconductor substrate with a wet etching liquid for a semiconductor through the dry-etched protective film as a mask and washing the wet-etched inorganic film or the semiconductor substrate.

Advantageous Effects of Invention

A composition for forming a protective film, for example, is required to have the following properties in a lithography process for manufacturing a semiconductor with an excellent balance. That is, the composition for forming a protective film has (1) an excellent mask function against a wet etching liquid at the time of processing a base substrate, has (2) a high dry etching rate, and is (3) excellent in flattening properties of a stepped substrate. The composition for forming a protective film of the present invention has the performance of (1) to (3) with an excellent balance, and thus, is capable of easily performing fine processing of a semiconductor substrate.

DESCRIPTION OF EMBODIMENTS

Description of Terms

Terms used in the present invention have the following definition, unless otherwise noted.

Examples of an "alkylene group having 1 to 10 carbon atoms" include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, or a n-decanylene group.

Examples of an "alkyl group having 1 to 10 carbon atoms" include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, a decyl group, an undecyl group, a dodecyl group, a tridecyl group, a tetradecyl group, a pentadecyl group, a hexadecyl group, a heptadecyl group, an octadecyl group, a nonadecyl group, an icodecyl group, and the like.

Examples of an "aryl group having 6 to 40 carbon atoms" include a phenyl group, an o-methyl phenyl group, a m-methyl phenyl group, a p-methyl phenyl group, o-chlorophenyl group, a m-chlorophenyl group, a p-chlorophenyl group, an o-fluorophenyl group, a p-fluorophenyl group, an o-methoxy phenyl group, a p-methoxy phenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of an "alkenyl group having 2 to 10 carbon atoms" include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propyl ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-1-pentenyl group, a 2-methyl-2-pentenyl group, a 2-methyl-3-pentenyl group, a 2-methyl-4-pentenyl group, a 2-n- propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butyl ethenyl group, a 1,3-dimethyl-1-butenyl group, a 1,3-dimethyl-2-butenyl group, a 1,3-dimethyl-3-butenyl group, a 1-i-butyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butyl ethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, a 3-cyclohexenyl group, and the like.

An "alkenylene group having 2 to 6 carbon atoms" indicates a divalent group obtained by removing one hydrogen atom from the alkenyl group having 2 to 6 carbon atoms exemplified in the "alkenyl group having 2 to 10 carbon atoms".

Examples of an "alicyclic hydrocarbon ring having 3 to 10 carbon atoms" include cyclopropane, cyclobutane, cyclopentane, cyclohexane, cycloheptane, cyclooctane, cyclononane, cyclodecane, spirobicyclopentane, bicyclo[2.1.0]pentane, bicyclo[3.2.1]octane, tricyclo[3.2.1.0$^{2.7}$]octane, spiro[3,4]octane, and the like.

An "aromatic hydrocarbon ring having 6 to 14 carbon atoms" indicates the aromatic hydrocarbon ring having 6 to 14 carbon atoms in the "aryl group having 6 to 40 carbon atoms".

An "alkynyl group having 2 to 6 carbon atoms" indicates a group in which a double bond of the alkenyl group having 2 to 6 carbon atoms exemplified in the "alkenyl group having 2 to 10 carbon atoms" is substituted with a triple bond.

Examples of an "alkoxy group having 1 to 20 carbon atoms" include a methoxy group, an ethoxy group, a n-propoxy group, an i-propoxy group, a n-butoxy group, an i-butoxy group, a s-butoxy group, a t-butoxy group, a n-pentyl oxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyl oxy group, a 1-methyl-n-pentyl oxy group, a 2-methyl-n-pentyl oxy group, a 3-methyl-n-pentyl oxy group, a 4-methyl-n-pentyl oxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a cyclopentyl oxy group, a cyclohexyl oxy group, a norbornyl oxy group, an adamantyl oxy group, an adamantane methyl oxy group, an adamantane ethyl oxy group, a tetracyclodecanyl oxy group, a tricyclodecanyl oxy group, and the like.

Examples of an "alkoxy carbonyl group having 1 to 6 carbon atoms" include a methoxy carbonyl group, an ethoxy carbonyl group, an isopropoxy carbonyl group, and the like.

Examples of an "alkylthio group having 1 to 6 carbon atoms" include a methylthio group, an ethylthio group, a propylthio group, a butylthio group, a pentylthio group, a hexylthio group, and the like.

Examples of a "halogen atom" include a fluorine atom, a chlorine atom, a bromine atom, and an iodine atom.

Examples of an "alkoxy group having 1 to 20 carbon atoms" include a methoxy group, an ethoxy group, a n-propoxy group, an i-propoxy group, a n-butoxy group, an i-butoxy group, a s-butoxy group, a t-butoxy group, a n-pentyl oxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyl oxy group, a 1-methyl-n-pentyl oxy group, a 2-methyl-n-pentyl oxy group, a 3-methyl-n-pentyl oxy group, a 4-methyl-n-pentyl oxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a cyclopentyloxy group, a cyclohexyloxy group, a norbornyloxy group, an adamantyloxy group, an adamantane methyloxy group, an adamantane ethyloxy group, a tetracyclodecanyloxy group, a tricyclodecanyloxy group, and the like.

"May be substituted" indicates that a part or all hydrogen atoms existing in the alkyl group having 1 to 10 carbon atoms or the aryl group having 6 to 40 carbon atoms, for example, may be substituted with a hydroxy group, a halogen atom, a carboxy group, a nitro group, a cyano group, a methylene dioxy group, an acetoxy group, a methylthio group, an amino group, or an alkoxy group having 1 to 9 carbon atoms.

<Composition for Forming Protective Film>

A composition for forming a protective film of the present application is a composition for forming a protective film against a wet etching liquid for a semiconductor, containing: a polymer having a structure including at a terminal thereof at least one pair of two hydroxy groups adjacent to each other in the molecule; and an organic solvent. Hereinafter, the description will be made in order.

<Structure Having at Least One Pair of Two Hydroxy Groups Adjacent to Each Other in the Molecule>

The structure including at least one pair of two hydroxy groups adjacent to each other in the molecule may be a 1,2-ethanediol structure (A).

The 1,2-ethanediol structure may include a structure represented by formula (1):

[Chemical Formula 6]

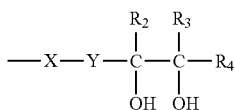

Formula (1)

(In formula (1), X represents any of —COO—, —OCO—, —O—, —S—, and —NR$_1$—, and R$_1$ represents a hydrogen atom or a methyl group. Y represents an alkylene group having 1 to 4 carbon atoms which may be substituted. R$_2$, R$_3$, and R$_4$ each represent a hydrogen atom, an alkyl group having 1 to 10 carbon atoms which may be substituted, or an aryl group having 6 to 40 carbon atoms, and R$_2$ may form a ring together with R$_3$ or R$_4$.)

Specific examples of the ring that is formed by R$_2$ together with R$_3$ or R$_4$ include a cyclopentane ring, a cyclohexane ring, a bicyclo[2,2,1]heptane ring, and the like.

In the case of forming the ring mentioned above, for example, the formation of the ring may be induced by allowing a compound such as cyclopentane-1,2-diol, cyclohexane-1,2-diol, and bicyclo[2,2,1]heptane-1,2-diol to react with a terminal of the polymer.

In formula (1) above, R$_2$, R$_3$, and R$_4$ may be a hydrogen atom.

In formula (1) above, Y may be a methylene group.

In formula (1) above, X may be —S—.

For example, the compound for forming the terminal of the polymer having the 1,2-ethanediol structure (A) includes those compounds represented by formula (A-1) to formula (A-4) below.

[Chemical Formula 7]

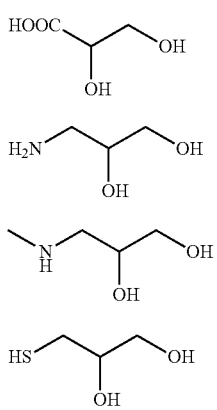

Formula(A-1)

Formula(A-2)

Formula(A-3)

Formula(A-4)

<Polymer>

The polymer mentioned above may be a reaction product of a diepoxy compound (B) and a bi- or higher-functional proton generating compound (C).

The reaction product mentioned above may include a partial structure represented by formula (2) below:

[Chemical Formula 8]

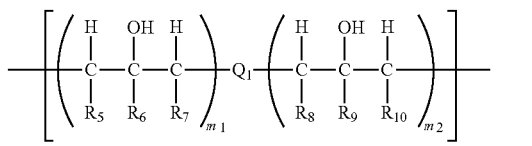

Formula (2)

(In formula (2), R$_5$, R$_6$, R$_7$, R$_8$, R$_9$, and R$_{10}$ each independently represent a hydrogen atom, a methyl group, or an ethyl group, Q$_1$ represents a divalent organic group between two carbon atoms, and m$_1$ and m$_2$ each independently represent 0 or 1.)

In formula (2) above, Q$_1$ may be represented by formula (3) below:

[Chemical Formula 9]

—Z$_1$-Q$_2$-Z$_2$—  Formula (3)

(In formula (3), Q$_2$ represents an alkylene group having 1 to 10 carbon atoms, which may be directly bonded or interrupted with —O—, —S—, or —S—S—, an alkenylene group having 2 to 6 carbon atoms, or a divalent organic group having at least one of an alicyclic hydrocarbon ring having 3 to 10 carbon atoms and an aromatic hydrocarbon ring having 6 to 14 carbon atoms; and the divalent organic group mentioned above may be substituted with at least one member selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxy carbonyl group having 1 to 6 carbon atoms, and an alkylthio group having 1 to 6 carbon atoms. Z$_1$ and Z$_2$ each represent any of —COO—, —OCO—, —O—, and —S—.)

In formula (2) above, Q$_1$ may be represented by formula (4) below:

[Chemical Formula 10]

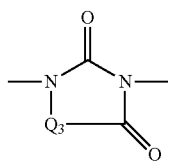

Formula (4)

(In formula (4), Q$_3$ represents formula (5), formula (6), or formula (7) below.)

[Chemical Formula 11]

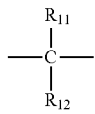

Formula (5)

Formula (6)

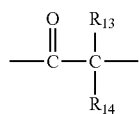

Formula (7)

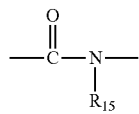

(In formula (5), formula (6), and formula (7), $R_{11}$, $R_{12}$, $R_{13}$, $R_{14}$, and $R_{15}$ each independently represent a hydrogen atom, an alkyl group having 1 to 6 carbon atoms, an alkenyl group having 3 to 6 carbon atoms, a benzyl group, or a phenyl group, the phenyl group may be substituted with at least one member selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms, and $R_{13}$ and $R_{14}$ may be bonded to each other to form a ring having 3 to 6 carbon atoms.)

For example, the diepoxy compound (B) having a structural unit represented by formula (2), in which $m_1$ and $m_2$ represent 1, includes those compounds containing diglycidyl ether and diglycidyl ester having two epoxy groups, represented by formula (B-1) to formula (B-46) below; however, it is not limited to the examples.

[Chemical Formula 12]

Formula (B-1)

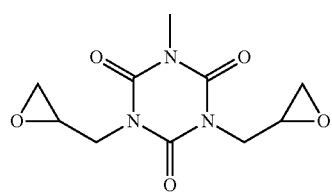

Formula (B-2)

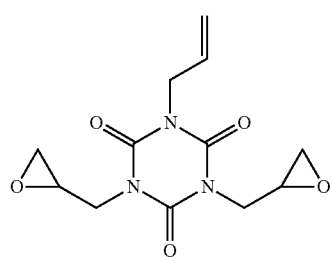

Formula (B-3)

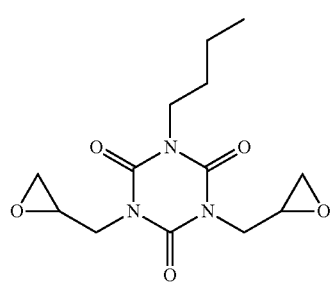

Formula (B-4)

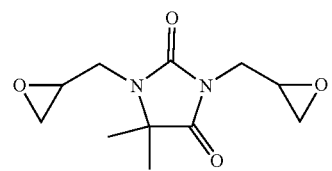

Formula (B-5)

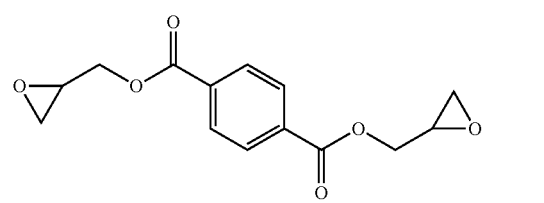

Formula (B-6)

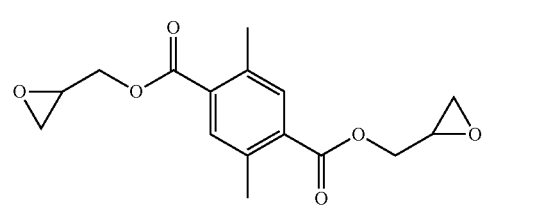

Formula (B-7)

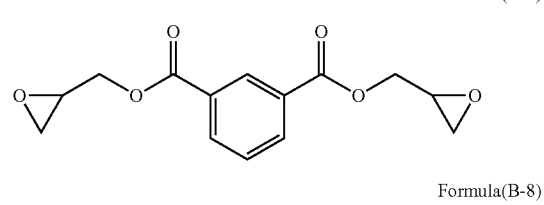

Formula (B-8)

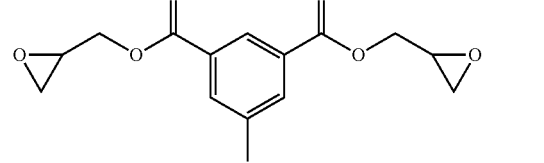

Formula (B-9)

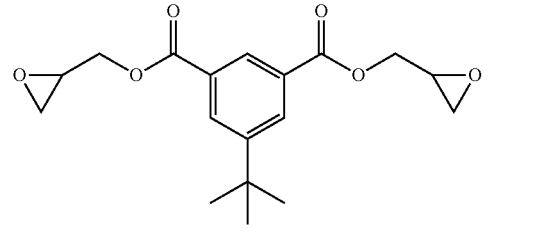

Formula (B-10)

Formula(B-11)
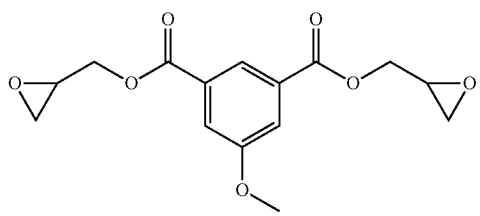
Formula(B-12)
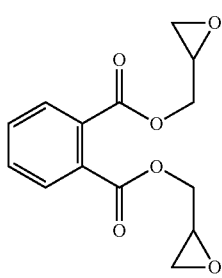
Formula(B-13)
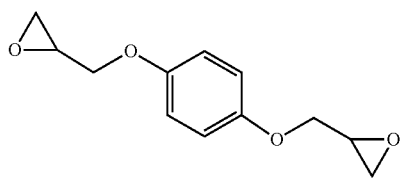
Formula(B-14)
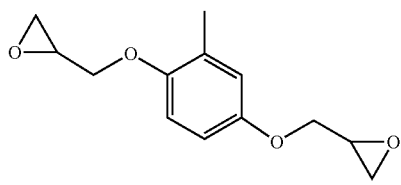
Formula(B-15)
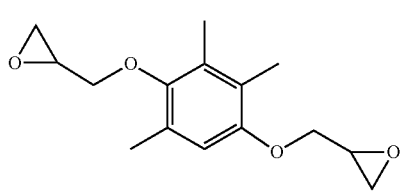
Formula(B-16)
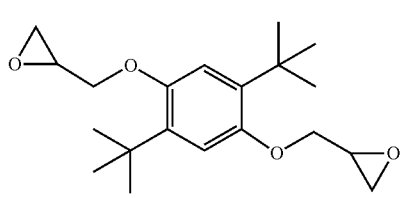
Formula(B-17)
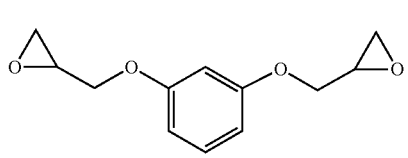
Formula(B-18)
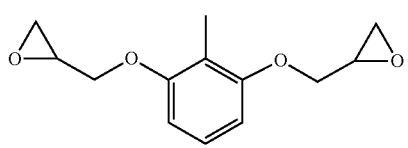
Formula(B-19)
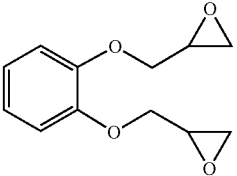
Formula(B-20)
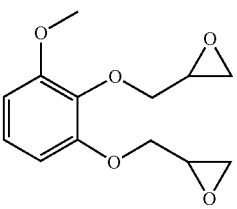
[Chemical Formula 13]
Formula(B-21)
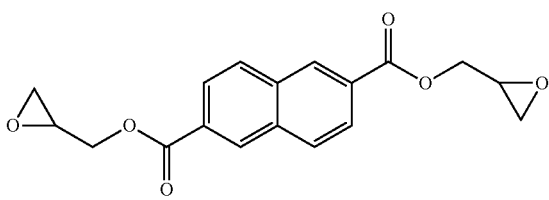
Formula(B-22)
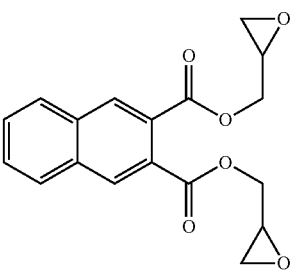
Formula(B-23)
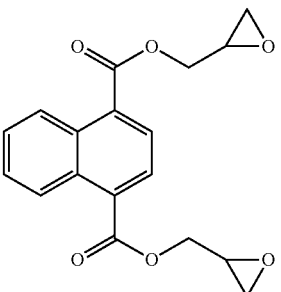
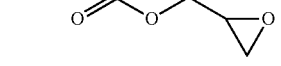
Formula(B-24)
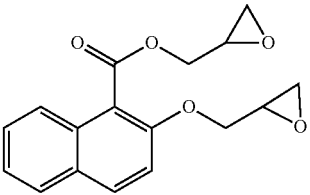

Formula(B-25)
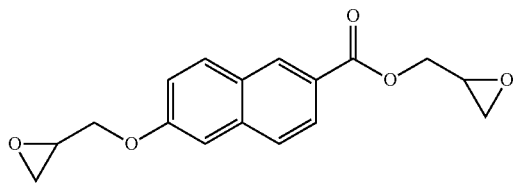
Formula(B-26)
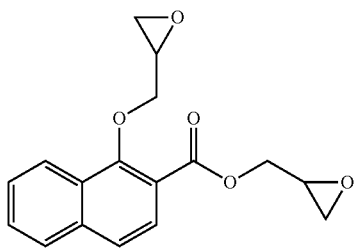
Formula(B-27)
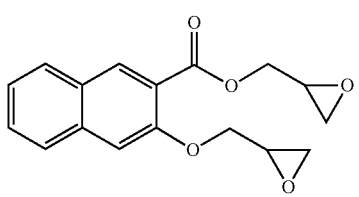
Formula(B-28)
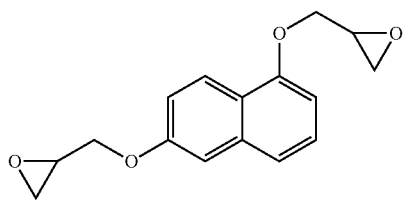
Formula(B-29)
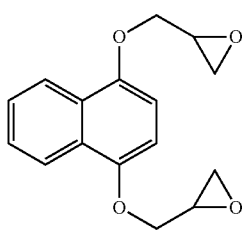
Formula(B-30)
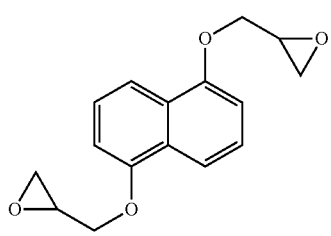
Formula(B-31)
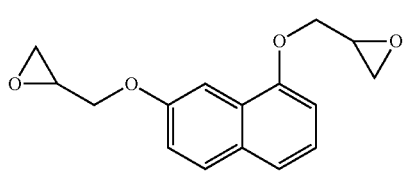
Formula(B-32)
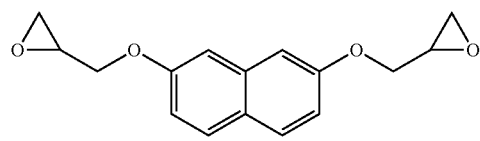
Formula(B-33)
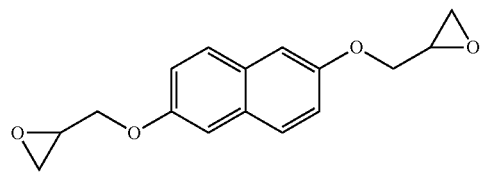
Formula(B-34)
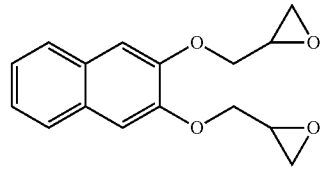
Formula(B-35)
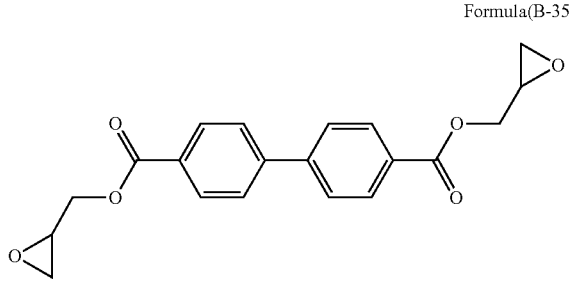
Formula(B-36)
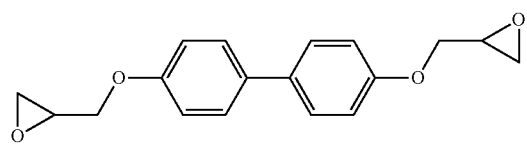
Formula(B-37)
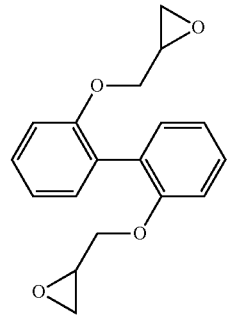
Formula(B-38)
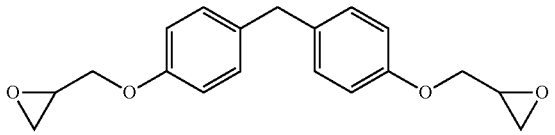

-continued

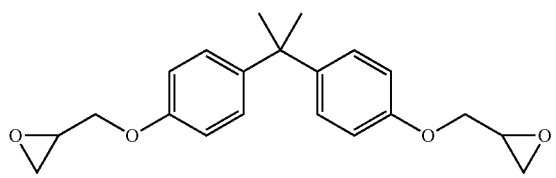
Formula(B-39)

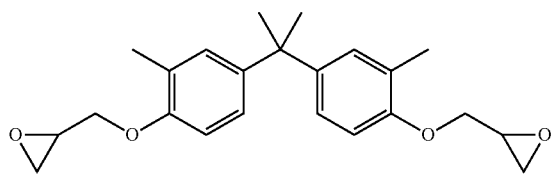
Formula(B-40)

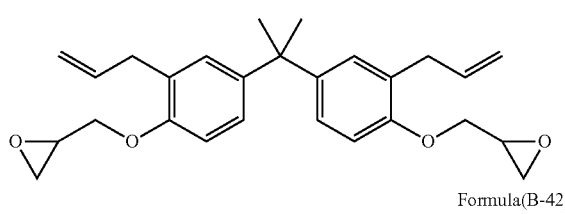
Formula(B-41)

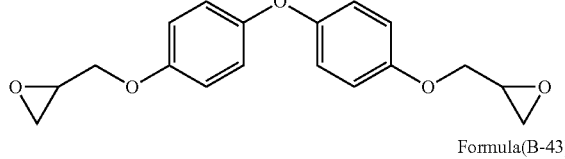
Formula(B-42)

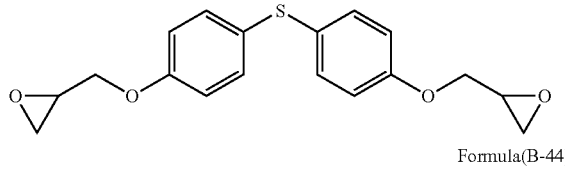
Formula(B-43)

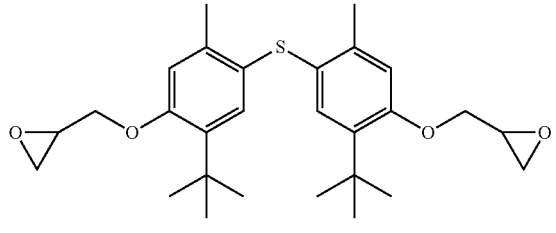
Formula(B-44)

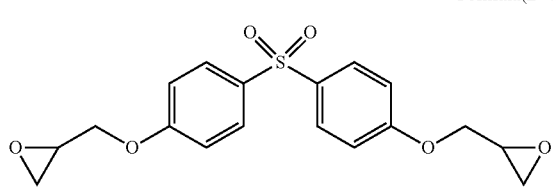
Formula(B-45)

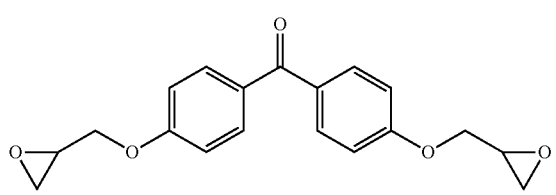
Formula(B-46)

For example, the bi- or higher-functional proton generating compound (C) having a structural unit represented by formula (2), in which $m_1$ and $m_2$ represent 0, includes those compounds having two carboxy groups, hydroxyphenyl groups, or imide groups, represented by formula (C-1) to formula (C-47) below, and an acid dianhydride; however, it is not limited to the examples.

[Chemical Formula 14]

HOOC—COOH  Formula(C-1)

HOOC–CH₂–COOH  Formula(C-2)

HOOC–(CH₂)₂–COOH  Formula(C-3)

HOOC–CH(CH₃)–CH₂–COOH  Formula(C-4)

HOOC–C(CH₃)₂–CH₂–COOH  Formula(C-5)

HOOC–CH(CH₃)–CH(CH₃)–COOH  Formula(C-6)

HOOC–CH=CH–COOH  Formula(C-7)

HOOC–C≡C–COOH  Formula(C-8)

HOOC–C(=CH₂)–CH₂–COOH  Formula(C-9)

HOOC–(CH₂)₃–COOH  Formula(C-10)

HOOC–CH(OH)–CH₂–COOH  Formula(C-11)

HOOC–CH(OH)–CH(OH)–COOH  Formula(C-12)

HOOC–CH₂–O–CH₂–COOH  Formula(C-13)

HOOC–CH₂–S–CH₂–COOH  Formula(C-14)

HOOC–CH₂–S–S–CH₂–COOH  Formula(C-15)

HOOC–(CH₂)₂–S–S–(CH₂)₂–COOH  Formula(C-16)

HOOC–CH₂–S–CH₂–S–CH₂–COOH  Formula(C-17)

HOOC–CH₂–S–(CH₂)₂–S–CH₂–COOH  Formula(C-18)

Formula(C-19)
Formula(C-20)
Formula(C-21)
Formula(C-22)
Formula(C-23)
[Chemical Formula 15]
Formula(C-24)
Formula(C-25)
Formula(C-26)
Formula(C-27)
Formula(C-28)
Formula(C-29)
Formula(C-30)
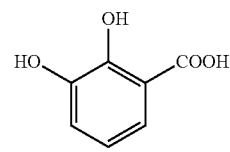
Formula(C-31)
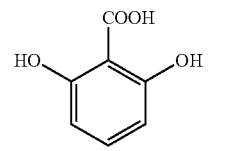
Formula(C-32)
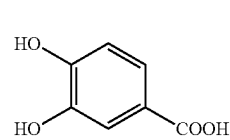
Formula(C-33)
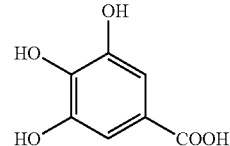
Formula(C-34)
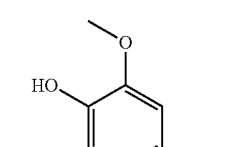
Formula(C-35)
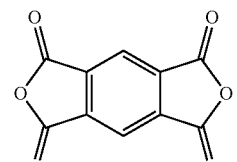
Formula(C-36)
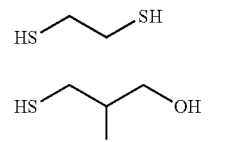
Formula(C-37)
Formula(C-38)
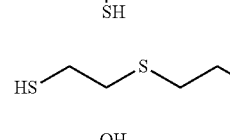
Formula(C-39)
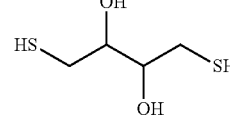
Formula(C-40)
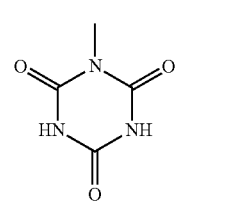

-continued

Formula(C-41)
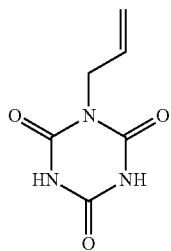

Formula(C-42)
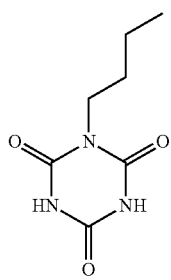

Formula(C-43)
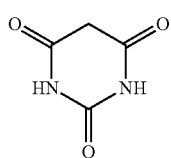

Formula(C-44)
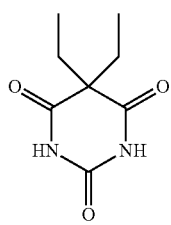

Formula(C-45)
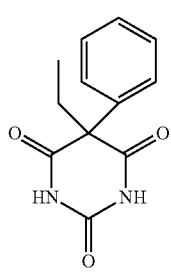

Formula(C-46)
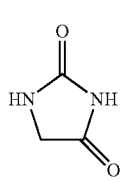

Formula(C-47)
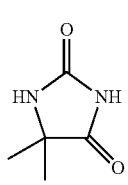

The weight average molecular weight of the polymer mentioned above, for example, is within the range of 1,000 to 30,000.

[Cross-Linking Agent]

The composition for forming a resist underlayer film of the present invention may contain a cross-linking agent. Examples of the cross-linking agent include a melamine-based cross-linking agent, a substituted urea-based cross-linking agent, or a polymer-based cross-linking agent thereof. Preferably, the cross-linking agent is a cross-linking agent having at least two cross-linkage forming substituents, and is a compound such as methoxymethylated glycoluril, butoxy methylated glycoluril, methoxymethylated melamine, butoxy methylated melamine, methoxymethylated benzoguanamine, butoxy methylated benzoguanamine, methoxymethylated urea, butoxy methylated urea, methoxymethylated thiourea, or methoxymethylated thiourea. In addition, a condensate of the compound may also be used.

In addition, a cross-linking agent having high thermal resistance may be used as the cross-linking agent mentioned above. A compound having a cross-linkage forming substituent having an aromatic ring (for example, a benzene ring and a naphthalene ring) in the molecule may be used as the cross-linking agent having high thermal resistance.

Examples of the compound include a compound having a partial structure of formula (5-1) below, and a polymer or an oligomer having a repeating unit of formula (5-2) below.

[Chemical Formula 16]

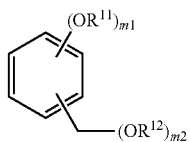

Formula (5-1)

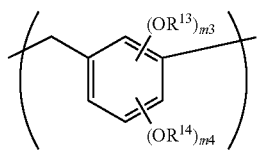

Formula (5-2)

$R^{11}$, $R^{12}$, $R^{13}$, and $R^{14}$ above are a hydrogen atom or an alkyl group having 1 to 10 carbon atoms, and specific examples of the alkyl group are as mentioned above.

m1 meet $1 \leq m1 \leq 6-m2$, m2 meets $1 \leq m2 \leq 5$, m3 meets $1 \leq m3 \leq 4-m2$, and m4 meets $1 \leq m4 \leq 3$.

The compound, the polymer, and the oligomer of formula (5-1) and formula (5-2) will be exemplified below.

[Chemical Formula 17]

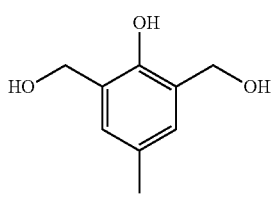

Formula(6-1)

Formula(6-2)
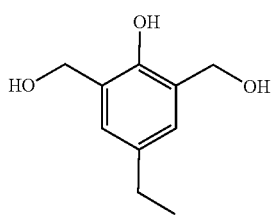
Formula(6-3)
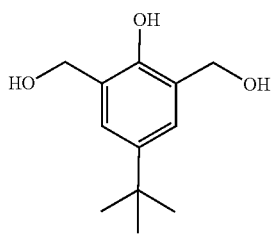
Formula(6-4)
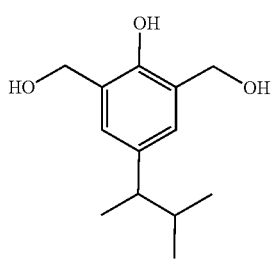
Formula(6-5)
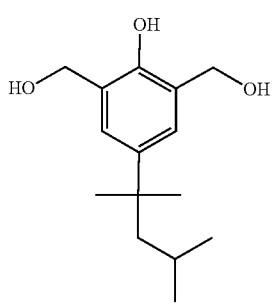
Formula(6-6)
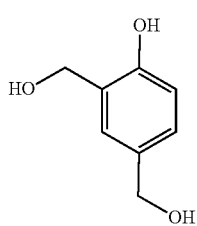
Formula(6-7)
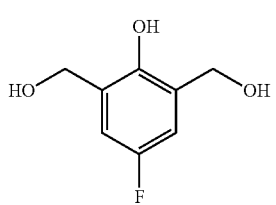
Formula(6-8)
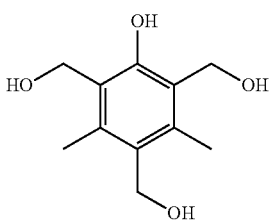
Formula(6-9)
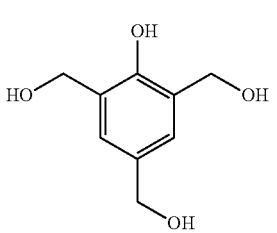
Formula(6-10)
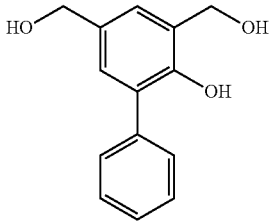
Formula(6-11)
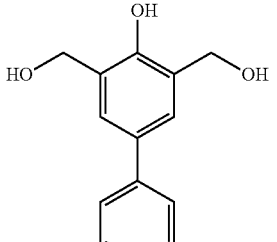
Formula(6-12)
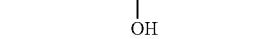
Formula(6-13)
Formula(6-14)

[Chemical Formula 18]

Formula(6-15)
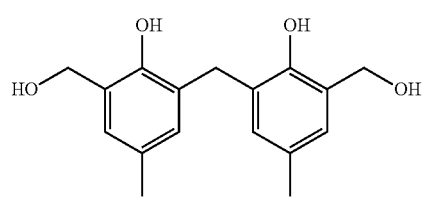

Formula(6-16)
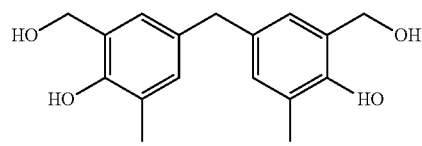

Formula(6-17)
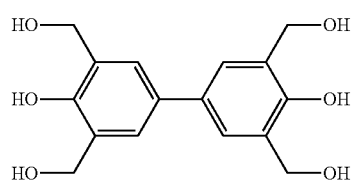

Formula(6-18)
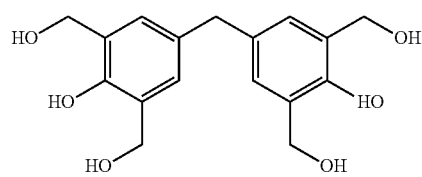

Formula(6-19)
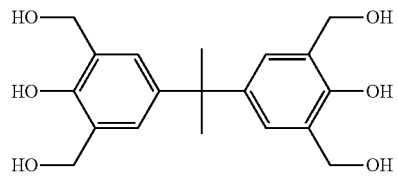

Formula(6-20)
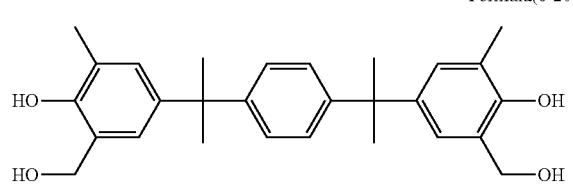

Fromula(6-21)
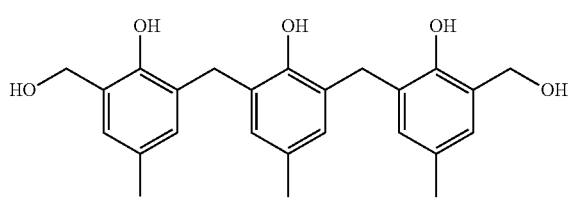

Formula(6-22)
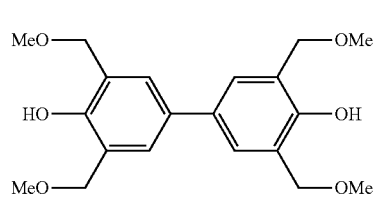

Formula(6-23)
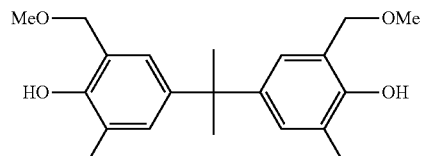

Formula(6-24)
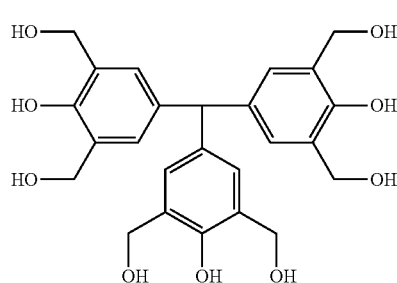

Formula(6-25)
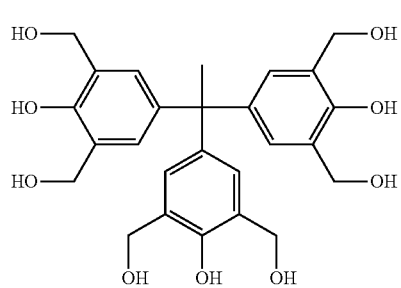

Formula(6-26)
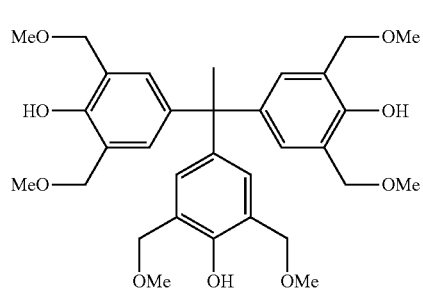

The compounds above are available as a product of ASAHI YUKIZAI CORPORATION and Honshu Chemical Industry Co., Ltd. For example, of the cross-linking agents mentioned above, the compound of formula (6-22) is available as TMOM-BP (Product Name) of ASAHI YUKIZAI CORPORATION.

The amount added of the cross-linking agent varies depending upon the coating solvent to be used, the base substrate to be used, the viscosity of solution to be required, the shape of film to be required, and the like. It is generally within the range of 0.001 to 80% by weight, preferably 0.01 to 50% by weight, and more preferably 0.1 to 40% by weight, based on the total solid content of the composition for forming a protective film. Such a cross-linking agent causes a cross-linking reaction due to self-condensation, and in a case where a cross-linkable substituent exists in the polymer of the present invention, the cross-linking agent is capable of causing a cross-linking reaction with the cross-linkable substituent.

[Cross-Linking Catalyst]

The composition for forming a protective film of the present invention may contain a cross-linking catalyst as an optional component in order to accelerate the cross-linking reaction. A compound generating an acid or a base by heat may be used as the cross-linking catalyst, in addition to an acidic compound and a basic compound, and a cross-linking acid catalyst is preferable. A sulfonic acid compound or a carboxyic acid compound may be used as the acidic compound, and a thermal acid generating agent may be used as the compound generating an acid by heat.

Examples of the sulfonic acid compound or the carboxyic acid compound include a p-toluene sulfonic acid, a trifluoromethane sulfonic acid, pyridinium trifluoromethane sulfonate, pyridinium-p-toluene sulfonate, a salicylic acid, a camphorsulfonic acid, a 5-sulfosalicylic acid, a 4-chlorobenzene sulfonic acid, a 4-phenol sulfonic acid, pyridinium-4-phenol sulfonate, a benzene disulfonic acid, a 1-naphthalene sulfonic acid, a 4-nitrobenzene sulfonic acid, a citric acid, a benzoic acid, and a hydroxy benzoic acid.

Examples of the thermal acid generating agent include K-PURE [registered trademark] CXC-1612, K-PURE CXC-1614, K-PURE TAG-2172, K-PURE TAG-2179, K-PURE TAG-2678, and K-PURE TAG2689 (all are manufactured by King Industries, Inc.), and SI-45, SI-60, SI-80, SI-100, SI-110, and SI-150 (all are manufactured by SANSHIN CHEMICAL INDUSTRY CO., LTD.).

The cross-linking catalysts may be used each alone or in combination of two or more. In addition, an amine compound or an ammonium hydroxide compound may be used as the basic compound, and urea may be used as the compound generating a base by heat.

Examples of the amine compound include tertiary amine such as triethanol amine, tributanol amine, trimethyl amine, triethyl amine, trinormal propyl amine, triisopropyl amine, trinormal butyl amine, tri-tert-butyl amine, trinormal octyl amine, triisopropanol amine, phenyl diethanol amine, stearyl diethanol amine, and diazabicyclooctane, and aromatic amine such as pyridine and 4-dimethyl aminopyridine. In addition, examples of the amine compound also include primary amine such as benzyl amine and normal butyl amine, and secondary amine such as diethyl amine and dinormal butyl amine. The amine compounds may be used each alone or in combination of two or more.

Examples of the ammonium hydroxide compound include tetramethyl ammonium hydroxide, tetraethyl ammonium hydroxide, tetrapropyl ammonium hydroxide, tetrabutyl ammonium hydroxide, benzyl trimethyl ammonium hydroxide, benzyl triethyl ammonium hydroxide, cetyl trimethyl ammonium hydroxide, phenyl trimethyl ammonium hydroxide, and phenyl triethyl ammonium hydroxide.

In addition, for example, a compound that has a thermolabile group such as an amide group, a urethane group, or an aziridine group and generates amine by heating may be used as the compound generating a base by heat. In addition, examples of the compound generating a base by heat also include urea, benzyl trimethyl ammonium chloride, benzyl triethyl ammonium chloride, benzyl dimethyl phenyl ammonium chloride, benzyl dodecyl dimethyl ammonium chloride, benzyl tributyl ammonium chloride, and choline chloride.

In a case where the composition for forming a protective film contains the cross-linking catalyst, the content thereof is generally within the range of 0.0001 to 20% by weight, preferably 0.01 to 15% by weight, and more preferably 0.1 to 10% by mass, based on the total solid content of the composition for forming a protective film.

[Surfactant]

The composition for forming a protective film of the present invention may contain a surfactant as an optional component in order to improve coating properties to a semiconductor substrate. Examples of the surfactant include a non-ionic surfactant such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenyl ether and polyoxyethylene nonyl phenyl ether; sorbitan fatty acid esters such as polyoxyethylene-polyoxypropylene block copolymers, sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, a fluorine-based surfactant such as Eftop [registered trademark] EF301, Eftop EF303, and Eftop EF352 (manufactured by Mitsubishi Materials Electronic Chemicals Co., Ltd.), MEGAFACE [registered trademark] F171, MEGAFACE F173, MEGAFACE R-30, MEGAFACE R-40, and MEGAFACE R-40-LM (manufactured by DIC Corporation), FLUORAD FC430 and FLUORAD FC431 (manufactured by Sumitomo 3M Ltd.), AsahiGuard [registered trademark] AG710, and Surflon [registered trademark] S-382, Surflon SC101, Surflon SC102, Surflon SC103, Surflon SC104, Surflon SC105, and Surflon SC106 (manufactured by Asahi Glass Co., Ltd.), and an organosiloxane polymer KP341 (manufactured by Shin-Etsu Chemical Co., Ltd.). The surfactants may be used each alone or in combination of two or more. In a case where the composition for forming a protective film contains the surfactant, the content thereof is generally within the range of 0.0001 to 10% by weight, and is preferably 0.01 to 5% by weight, based on the total solid content of the composition for forming a protective film.

[Solvent]

The composition for forming a protective film of the present invention can be prepared by dissolving each component mentioned above in an organic solvent, and is used in a homogeneous solution state.

The solvent of the composition for forming a protective film according to the present invention may be used without being particularly limited insofar as it can dissolve the compound including at least one pair of two hydroxy groups adjacent to each other in the molecule, or the polymer thereof. In particular, the composition for forming a protective film according to the present invention is used in a homogeneous solution state, and thus, in consideration of coating performance thereof, it is recommended to use a solvent that is generally used in a photolithography process together.

Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, 2-hydroxy methyl isobutyrate, 2-hydroxy ethyl isobutyrate, ethoxy ethyl acetate, 2-hydroxy ethyl acetate, 3-methoxymethyl propionate, 3-methoxy ethyl propionate, 3-ethoxy ethyl propionate, 3-ethoxy methyl propionate, methyl pyruvate, ethyl pyruvate, ethyl acetate, butyl acetate, ethyl lactate, butyl lactate, 2-heptanone, methoxy cyclopentane, anisole, 7-butyrolactone, N-methyl pyrrolidone, N,N-dimethyl formamide, and N,N-dimethyl acetamide. The solvents may be used each alone or in combination of two or more.

Of the solvents, propylene glycol monomethyl ether, propylene glycol monomethyl ether acetate, ethyl lactate, butyl lactate, cyclohexanone, and the like are preferable. In particular, propylene glycol monomethyl ether and propylene glycol monomethyl ether acetate are preferable.

[Other Components]

A light absorbent, a rheology modifier, an adhesive auxiliary agent, and the like may be added to the composition for forming a protective film of the present invention. The rheology modifier is effective for improving the fluidity of the composition for forming a protective film. The adhesive auxiliary agent is effective for improving adhesiveness between the semiconductor substrate or the resist and the underlayer film.

For example, a commercially available light absorbent described in "Technology and Market of Industrial Pigment" (CMC Publishing Co., Ltd.) or "Colorant Handbook" (edited by The Society of Synthetic Organic Chemistry, Japan.), for example, C.I. Disperse Yellow 1, 3, 4, 5, 7, 8, 13, 23, 31, 49, 50, 51, 54, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Orange 2 and 45; C.I. Solvent Red 1, 3, 8, 23, 24, 25, 27, and 49; C.I. Pigment Green 10; C.I. Pigment Brown 2, and the like may be preferably used as the light absorbent.

The light absorbent is blended at a ratio of generally less than or equal to 10% by mass, and preferably less than or equal to 5% by mass, based on the total solid content of the composition for forming a protective film.

The rheology modifier mainly improves the fluidity of the composition for forming a protective film, and in particular, is added in order to improve film thickness homogeneousness of the resist underlayer film or to increase filling properties of the composition for forming a protective film into the inside of a hole, in a baking step. Specific examples of the rheology modifier includes a phthalic acid derivative such as dimethyl phthalate, diethyl phthalate, diisobutyl phthalate, dihexyl phthalate, and butyl isodecyl phthalate, an adipic acid derivative such as dinormal butyl adipate, diisobutyl adipate, diisooctyl adipate, and octyl decyl adipate, a maleic acid derivative such as dinormal butyl malate, diethyl malate, and dinonyl malate, an oleic acid derivative such as methyl oleate, butyl oleate, and tetrahydrofurfuryl oleate, or a stearic acid derivative such as normal butyl stearate and glyceryl stearate. The rheology modifier is blended at a ratio of generally less than 30% by mass, based on the total solid content of the composition for forming a protective film.

The adhesive auxiliary agent mostly improves the adhesiveness between the substrate or the resist and the composition for forming a protective film. In particular, it is added such that a resist is not peeled off, in a developing step. Specific examples of the adhesive auxiliary agent include chlorosilanes such as trimethyl chlorosilane, dimethyl methylol chlorosilane, methyl diphenyl chlorosilane, and chloromethyl dimethyl chlorosilane, alkoxy silanes such as trimethyl methoxy silane, dimethyl diethoxy silane, methyl dimethoxy silane, dimethyl methylol ethoxy silane, diphenyl dimethoxy silane, and phenyl triethoxy silane, silazanes such as hexamethyl disilazane, N,N'-bis(trimethyl silyl) urea, dimethyl trimethyl silyl amine, and trimethyl silyl imidazole, silanes such as methylol trichlorosilane, 7-chloropropyl trimethoxy silane, 7-aminopropyl triethoxy silane, and 7-glycidoxy propyl trimethoxy silane, a heterocyclic compound such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine, urea such as 1,1-dimethyl urea and 1,3-dimethyl urea, or a thiourea compound. The adhesive auxiliary agent is blended at a ratio of generally less than 5% by mass, and preferably less than 2% by mass, based on the total solid content of the composition for forming a protective film.

[Composition for Forming Protective Film]

A solid content of the composition for forming a protective film according to the present invention is generally within the range of 0.1 to 70% by mass, and preferably 0.1 to 60% by mass. The solid content is a content ratio of all of the components excluding the solvent from the composition for forming a protective film. The ratio of the polymer in the solid content is preferably within the order of 1 to 100% by mass, 1 to 99.9% by mass, 50 to 99.9% by mass, 50 to 95% by mass, and 50 to 90% by mass.

[Manufacturing Method of Substrate with Resist Pattern and Semiconductor Device]

Hereinafter, a manufacturing method of a substrate with a resist pattern and a manufacturing method of a semiconductor device, using the composition for forming a protective film according to the present invention, will be described.

A substrate with a resist pattern according to the present invention can be manufactured by applying the composition for forming a protective film onto a semiconductor substrate, and by calcining the composition.

Examples of the semiconductor substrate that is coated with the composition for forming a protective film of the present invention include a silicon wafer, a germanium wafer, and a compound semiconductor wafer such as gallium arsenide, indium phosphide, gallium nitride, indium nitride, and aluminum nitride.

In the case of using a semiconductor substrate in which an inorganic film is formed on the surface, the inorganic film, for example, is formed by an atomic layer deposition (ALD) method, a chemical vapor deposition (CVD) method, a reactive sputtering method, an ion plating method, a vacuum deposition method, and a spin coating method (spin-on-glass: SOG). Examples of the inorganic film include a polysilicon film, a silicon oxide film, a silicon nitride film, a silicon oxynitride film, a boro-phospho silicate glass (BPSG) film, a titanium nitride film, a titanium oxynitride film, a tungsten nitride film, a gallium nitride film, and a gallium arsenide film.

The composition for forming a protective film of the present invention is applied onto such a semiconductor substrate by a suitable coating method such as a spinner and a coater. After that, the composition is baked by using a heating unit such as a hot plate, and thus, a protective film is formed. As baking conditions, a baking temperature is suitably selected from 100° C. to 400° C. and a baking time is suitably selected from 0.3 minutes to 60 minutes. The baking temperature is preferably within the range of 120° C. to 350° C. and the baking time is preferably within the range of 0.5 minutes to 30 minutes, and the baking temperature is more preferably within the range of 150° C. to 300° C. and the baking time is more preferably within the range of 0.8 minutes to 10 minutes. A film thickness of the protective film to be formed is, for example, within the range of 0.001 μm to 10 μm, preferably 0.002 μm to 1 μm, and more preferably 0.005 μm to 0.5 μm. In a case where the baking temperature is lower than the range mentioned above, cross-linkage can be insufficient, and the resistance of the protective film to be formed against a resist solvent or a basic hydrogen peroxide aqueous solution may be less likely to be obtained. To the contrary, in a case where the baking temperature is higher than the range mentioned above, the protective film may be decomposed by heat.

Exposure is performed through a mask (a reticle) for forming a predetermined pattern, and for example, an i-ray, a KrF excimer laser, an ArF excimer laser, an extreme-ultraviolet ray (EUV), or an electron beam (EB) is used. An alkaline developing liquid is used in developing, and a developing temperature is suitably selected from 5° C. to 50° C. and a developing time is suitably selected from 10 seconds to 300 seconds. For example, an aqueous solution of alkalies such as inorganic alkalies such as sodium hydroxide, potassium hydroxide, sodium carbonate, sodium silicate, sodium metasilicate, and ammonia water, primary amines such as ethyl amine and n-propyl amine, secondary amines such as diethyl amine and di-n-butyl amine, tertiary amines such as triethyl amine and methyl diethyl amine, alcohol amines such as dimethyl ethanol amine and triethanol amine, a quaternary ammonium salt such as tetramethyl ammonium hydroxide, tetraethyl ammonium hydroxide, and choline, and cyclic amines such as pyrrole and piperidine may be used as the alkaline developing liquid. Further, the aqueous solution of the alkalies mentioned above may also be used by adding a suitable amount of alcohols such as isopropyl alcohol and a non-ionic surfactant thereto. Among them, a quaternary ammonium salt is preferable, and tetramethyl ammonium hydroxide and choline are more preferable, as the developing liquid. Further, a surfactant or the like may also be added to the developing liquid. A method of performing developing with an organic solvent such as butyl acetate in place of the alkaline developing liquid so as to develop a portion of a photoresist in which an alkali dissolution rate is not improved may also be used.

Next, the protective film is subjected to dry etching by using the formed resist pattern as a mask. At this time, in a case where the inorganic film mentioned above is formed on the surface of the used semiconductor substrate, the surface of the inorganic film is exposed. In a case where the inorganic film mentioned above is not formed on the surface of the used semiconductor substrate, the surface of the semiconductor substrate is exposed.

Further, wet etching is performed with a wet etching liquid for a semiconductor by using the protective film after the dry etching (also using the resist pattern in a case where the resist pattern remains on the protective film) as a mask, and thus, a desired pattern is formed.

A general chemical solution for performing etching processing against a semiconductor wafer may be used as the wet etching liquid for a semiconductor. For example, both of an acidic substance and a basic substance may be used.

Examples of the acidic substance include hydrogen peroxide, a hydrofluoric acid, ammonium fluoride, acidic ammonium fluoride, ammonium hydrogendifluoride, a buffered hydrofluoric acid, a hydrochloric acid, a nitric acid, a sulfuric acid, a phosphoric acid, or a mixed liquid thereof.

Examples of the basic substance include ammonia, sodium hydroxide, potassium hydroxide, sodium cyanide, potassium cyanide, and basic hydrogen peroxide solution obtained by mixing an organic amine such as triethanolamine and aqueous hydrogen peroxide and adjusting basic pH. Specific examples of the basic substance include an ammonia-hydrogen peroxide solution (SC-1). In addition, a hydrogen peroxide solution adjustable to a basic pH, for example, a hydrogen peroxide solution in which urea and hydrogen peroxide solution are mixed, and urea is thermally decomposed by heating to generate ammonia, which ultimately achieves a basic pH, may also be used as the chemical solution for wet etching.

Among them, acidic hydrogen peroxide solution or basic hydrogen peroxide solution is preferable.

Such a chemical solution may contain an additive such as a surfactant.

The temperature for using the wet etching liquid for a semiconductor is desirably within the range of 25° C. to 90° C., and is more desirably 40° C. to 80° C. The wet etching time is desirably within the range of 0.5 minutes to 30 minutes, and more desirably 1 minute to 20 minutes.

EXAMPLES

Next, the present invention will be described in detail by using examples, but the present invention is not limited thereto.

The device and the like used in the measurement of the weight average molecular weight of the polymers obtained in the synthesis examples below are as follows.

Device: HLC-8320GPC, manufactured by Tosoh Corporation
GPC Column: Shodex [registered trademark]—Asahipak [registered trademark](manufactured by Showa Denko K.K.)
Column Temperature: 40° C.
Flow Rate: 0.35 mL/minute
Eluent: Tetrahydrofuran (THF)
Reference Sample: Polystyrene (manufactured by Tosoh Corporation)

Example 1

A reaction flask, in which 35.27 g of propylene glycol monomethyl ether was added to 13.00 g of methyl diglycidyl isocyanurate (Product Name: MeDGIC, manufactured by SHIKOKU CHEMICALS CORPORATION, 49.2% by weight of a propylene glycol monomethyl ether solution), 2.36 g of a succinic acid, 1.08 g of 1-thioglycerol, and 0.64 g of tetrabutyl phosphonium bromide, was heated and stirred at 100° C. for 23 hours in a nitrogen atmosphere. The reaction product corresponded to formula (D-1), and the weight average molecular weight Mw determined by GPC in terms of polystyrene was 1,400.

[Chemical Formula 19]

Formula (D-1)

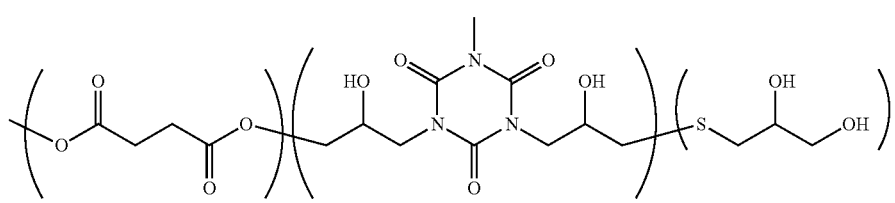

4.26 g of a solution of the reaction product (a solid content of 17.3% by weight) corresponding to formula (D-1) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.67 g of propylene glycol monomethyl ether, and 1.91 g of propylene glycol monomethyl ether acetate were added, and thus, a solution of a composition for forming a protective film was prepared.

Example 2

A reaction flask, in which 50.01 g of propylene glycol monomethyl ether was added to 8.00 g of diglycidyl terephthalic acid ester (Product Name: DENACOL EX-711, manufactured by Nagase ChemteX Corporation), 2.61 g of a succinic acid, 1.19 g of 1-thioglycerol, and 0.70 g of tetrabutyl phosphonium bromide, was heated and stirred at 100° C. for 23 hours in a nitrogen atmosphere. The reaction product corresponded to formula (D-2), and the weight average molecular weight Mw determined by GPC in terms of polystyrene was 3,700.

[Chemical Formula 20]

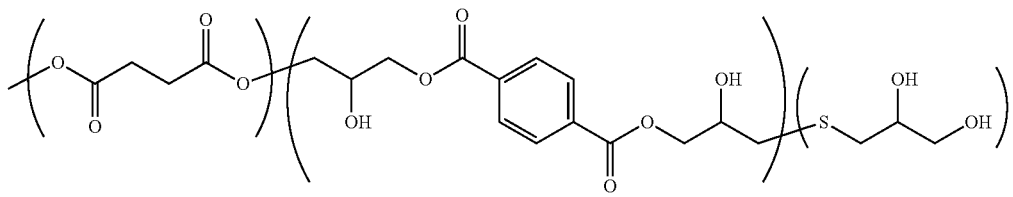

Formula (D-2)

4.45 g of a solution of the reaction product (a solid content of 16.6% by weight) corresponding to formula (D-2) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.48 g of propylene glycol monomethyl ether, and 1.91 g of propylene glycol monomethyl ether acetate were added, and thus, a solution of a composition for forming a protective film was prepared.

Example 3

A reaction flask, in which 50.06 g of propylene glycol monomethyl ether was added to 7.00 g of diglycidyl terephthalic acid ester (Product Name: DENACOL EX-711, manufactured by Nagase ChemteX Corporation), 4.06 g of a 3,3'-dithiopropionic acid, 1.04 g of 1-thioglycerol, and 0.41 g of tetrabutyl phosphonium bromide, was heated and stirred at 100° C. for 24 hours in a nitrogen atmosphere. The reaction product corresponded to formula (D-3), and the weight average molecular weight Mw determined by GPC in terms of polystyrene was 4,300.

[Chemical Formula 21]

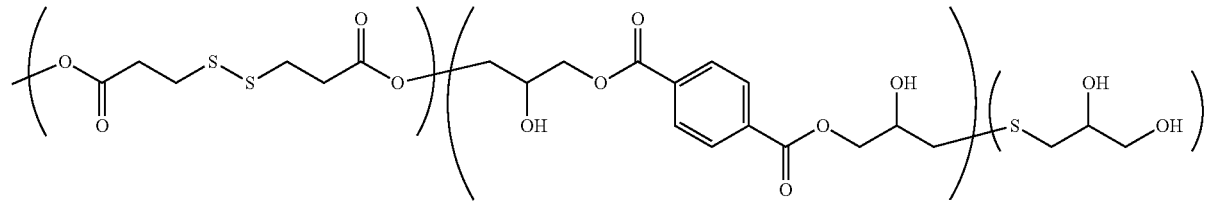

Formula (D-3)

4.85 g of a solution of the reaction product (a solid content of 15.2% by weight) corresponding to formula (D-3) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.08 g of propylene glycol monomethyl ether, and 1.91 g of propylene glycol monomethyl ether acetate were added, and thus, a solution of a composition for forming a protective film was prepared.

Example 4

A reaction flask, in which 51.90 g of propylene glycol monomethyl ether was added to 8.00 g of diglycidyl terephthalic acid ester (Product Name: DENACOL EX-711, manufactured by Nagase ChemteX Corporation), 3.31 g of a 2,2'-thiodiglycolic acid, 1.19 g of 1-thioglycerol, and 0.47 g of tetrabutyl phosphonium bromide, was heated and stirred at 100° C. for 24 hours in a nitrogen atmosphere. The reaction product corresponded to formula (D-4), and the weight average molecular weight Mw determined by GPC in terms of polystyrene was 2,700.

[Chemical Formula 22]

Formula (D-4)

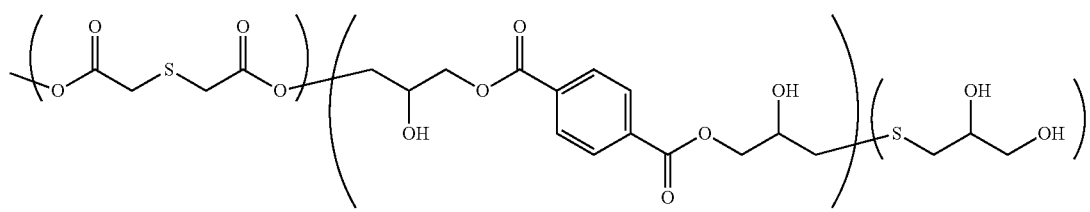

4.43 g of a solution of the reaction product (a solid content of 16.6% by weight) corresponding to formula (D-4) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.50 g of propylene glycol monomethyl ether, and 1.91 g of propylene glycol monomethyl ether acetate were added, and thus, a solution of a composition for forming a protective film was prepared.

Example 5

A reaction flask, in which 49.03 g of propylene glycol monomethyl ether was added to 8.00 g of diglycidyl phthalic acid ester (Product Name: DENACOL EX-721, manufactured by Nagase ChemteX Corporation), 2.47 g of a succinic acid, 1.13 g of 1-thioglycerol, and 0.66 g of tetrabutyl phosphonium bromide, was heated and stirred at 100° C. for 23 hours in a nitrogen atmosphere. The reaction product corresponded to formula (D-5), and the weight average molecular weight Mw determined by GPC in terms of polystyrene was 2,100.

[Chemical Formula 23]

Formula (D-5)

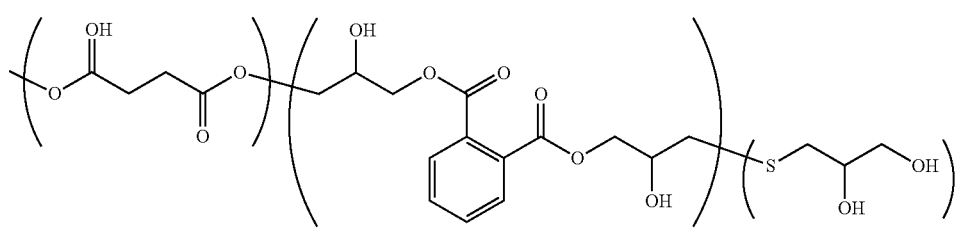

4.58 g of a solution of the reaction product (a solid content of 16.1% by weight) corresponding to formula (D-5) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.35 g of propylene glycol monomethyl ether, and 1.91 g of propylene glycol monomethyl ether acetate were added, and thus, a solution of a composition for forming a protective film was prepared.

Example 7

A reaction flask, in which 41.51 g of propylene glycol monomethyl ether was added to 12.00 g of resorcinol diglycidyl ether (Product Name: DENACOL EX-201-IM, manufactured by Nagase ChemteX Corporation, 50.0% by weight of a propylene glycol monomethyl ether solution), 4.33 g of a 3,3'-dithiopropionic acid, 1.11 g of 1-thioglycerol, and 0.44 g of tetrabutyl phosphonium bromide, was heated and stirred at 100° C. for 23 hours in a nitrogen atmosphere. The reaction product corresponded to formula (D-7), and the weight average molecular weight Mw determined by GPC in terms of polystyrene was 4,700.

[Chemical Formula 25]

Formula (D-7)

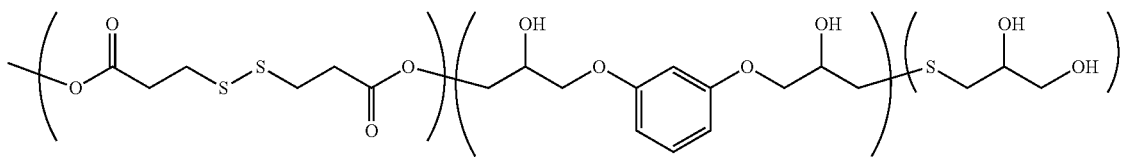

Example 6

A reaction flask, in which 40.59 g of propylene glycol monomethyl ether was added to 14.00 g of resorcinol diglycidyl ether (Product Name: DENACOL EX-201-IM, manufactured by Nagase ChemteX Corporation, 50.0% by weight of a propylene glycol monomethyl ether solution), 2.84 g of a succinic acid, 1.30 g of 1-thioglycerol, and 0.76 g of tetrabutyl phosphonium bromide, was heated and stirred at 100° C. for 23 hours in a nitrogen atmosphere. The reaction product corresponded to formula (D-6), and the weight average molecular weight Mw determined by GPC in terms of polystyrene was 3,600.

4.57 g of a solution of the reaction product (a solid content of 16.1% by weight) corresponding to formula (D-7) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.36 g of propylene glycol monomethyl ether, and 1.91 g of propylene glycol monomethyl ether acetate were added, and thus, a solution of a composition for forming a protective film was prepared.

[Chemical Formula 24]

Formula (D-6)

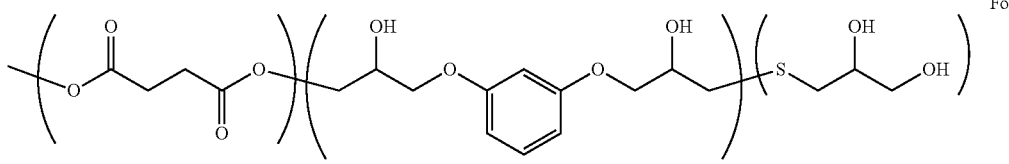

4.54 g of a solution of the reaction product (a solid content of 16.2% by weight) corresponding to formula (D-6) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.38 g of propylene glycol monomethyl ether, and 1.91 g of propylene glycol monomethyl ether acetate were added, and thus, a solution of a composition for forming a protective film was prepared.

Example 8

A reaction flask, in which 39.61 g of propylene glycol monomethyl ether was added to 13.00 g of resorcinol diglycidyl ether (Product Name: DENACOL EX-201-IM, manufactured by Nagase ChemteX Corporation, 50.0% by weight of a propylene glycol monomethyl ether solution), 3.35 g of a 2,2'-thiodiglycolic acid, 1.21 g of 1-thioglycerol, and 0.47 g of tetrabutyl phosphonium bromide, was heated and stirred at 100° C. for 23 hours in a nitrogen atmosphere. The reaction product corresponded to formula (D-8), and the weight average molecular weight Mw determined by GPC in terms of polystyrene was 1,900.

[Chemical Formula 26]

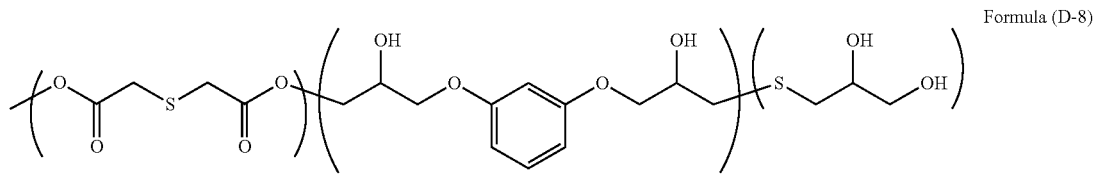

Formula (D-8)

4.45 g of a solution of the reaction product (a solid content of 16.6% by weight) corresponding to formula (D-8) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.48 g of propylene glycol monomethyl ether, and 1.91 g of propylene glycol monomethyl ether acetate were added, and thus, a solution of a composition for forming a protective film was prepared.

Comparative Example 1

A reaction flask, in which 27.44 g of propylene glycol monomethyl ether was added to 10.00 g of methyl isocyanurate diglycidyl (Product Name: MeDGIC, manufactured by SHIKOKU CHEMICALS CORPORATION, 49.2% by weight of a propylene glycol monomethyl ether solution), 2.72 g of a succinic acid, and 0.49 g of tetrabutyl phosphonium bromide, was heated and stirred at 100° C. for 23 hours in a nitrogen atmosphere. The reaction product corresponded to formula (E-1), and the weight average molecular weight Mw determined by GPC in terms of polystyrene was 1,400.

[Chemical Formula 27]

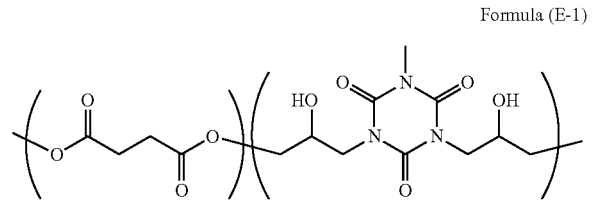

Formula (E-1)

4.21 g of a solution of the reaction product (a solid content of 17.5% by weight) corresponding to formula (E-1) above, 0.15 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.72 g of propylene glycol monomethyl ether, and 1.91 g of propylene glycol monomethyl ether acetate were added, and thus, a solution of a composition for forming a protective film was prepared.

Comparative Example 2

A reaction flask, in which 62.11 g of propylene glycol monomethyl ether was added to 10.00 g of diglycidyl terephthalic acid ester (Product Name: DENACOL EX-711, manufactured by Nagase ChemteX Corporation), 4.89 g of a succinic acid, and 0.64 g of ethyl triphenyl phosphonium bromide, was heated and stirred at 100° C. for 23 hours in a nitrogen atmosphere. The reaction product corresponded to formula (E-2), and the weight average molecular weight Mw determined by GPC in terms of polystyrene was 3,100.

[Chemical Formula 28]

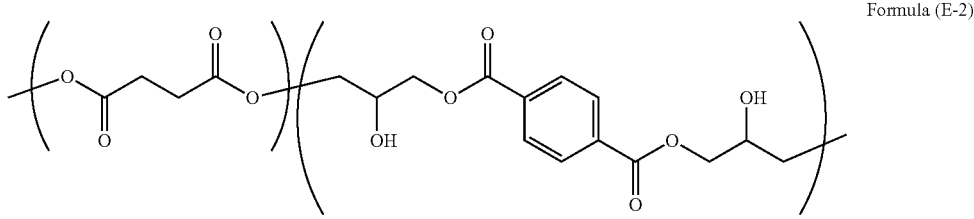

Formula (E-2)

4.03 g of a solution of the reaction product (a solid content of 16.3% by weight) corresponding to formula (E-2) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.91 g of propylene glycol monomethyl ether, and 1.92 g of propylene glycol monomethyl ether acetate were added, and thus, a solution of a composition for forming a protective film was prepared.

Comparative Example 3

A reaction flask, in which 107.76 g of propylene glycol monomethyl ether was added to 10.00 g of diglycidyl terephthalic acid ester (Product Name: DENACOL EX-711, manufactured by Nagase ChemteX Corporation), 8.70 g of a 3,3'-dithiopropionic acid, and 0.31 g of benzyl triethyl ammonium chloride, was heated and stirred at 100° C. for 24 hours in a nitrogen atmosphere. The reaction product corresponded to formula (E-3), and the weight average molecular weight Mw determined by GPC in terms of polystyrene was 3,200.

[Chemical Formula 29]

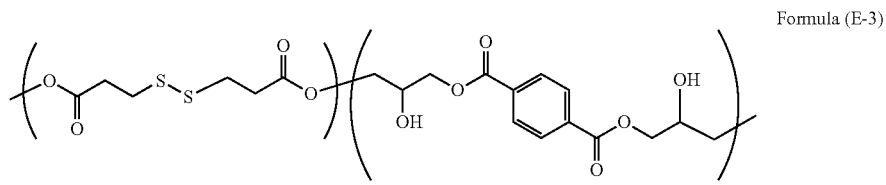

Formula (E-3)

4.04 g of a solution of the reaction product (a solid content of 16.2% by weight) corresponding to formula (E-3) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.89 g of propylene glycol monomethyl ether, and 1.92 g of propylene glycol monomethyl ether acetate were added, and thus, a solution of a composition for forming a protective film was prepared.

Comparative Example 4

A reaction flask, in which 67.42 g of propylene glycol monomethyl ether was added to 10.00 g of diglycidyl terephthalic acid ester (Product Name: DENACOL EX-711, manufactured by Nagase ChemteX Corporation), 6.21 g of a 2,2'-thiodiglycolic acid, and 0.64 g of ethyl triphenyl phosphonium bromide, was heated and stirred at 100° C. for 23 hours in a nitrogen atmosphere. The reaction product corresponded to formula (E-4), and the weight average molecular weight Mw determined by GPC in terms of polystyrene was 2,700.

[Chemical Formula 30]

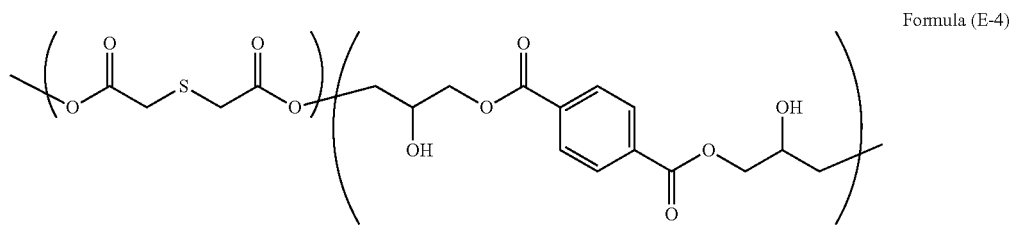

Formula (E-4)

3.93 g of a solution of the reaction product (a solid content of 16.7% by weight) corresponding to formula (E-4) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 14.00 g of propylene glycol monomethyl ether, and 1.92 g of propylene glycol monomethyl ether acetate were added, and thus, a solution of a composition for forming a protective film was prepared.

Comparative Example 5

A reaction flask, in which 60.91 g of propylene glycol monomethyl ether was added to 10.00 g of diglycidyl phthalic acid ester (Product Name: DENACOL EX-721, manufactured by Nagase ChemteX Corporation), 4.62 g of a succinic acid, and 0.61 g of ethyl triphenyl phosphonium bromide, was heated and stirred at 100° C. for 27 hours in a nitrogen atmosphere. The reaction product corresponded to formula (E-5), and the weight average molecular weight Mw determined by GPC in terms of polystyrene was 1,900.

[Chemical Formula 31]

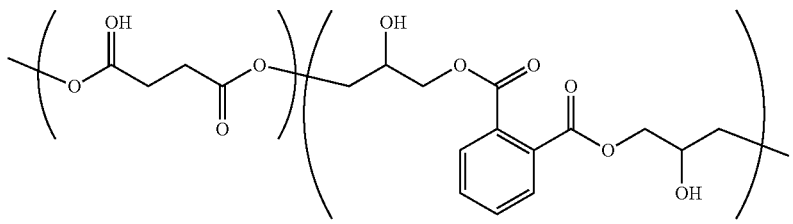

Formula (E-5)

4.07 g of a solution of the reaction product (a solid content of 16.1% by weight) corresponding to formula (E-5) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.87 g of propylene glycol monomethyl ether, and 1.92 g of propylene glycol monomethyl ether acetate were added, and thus, a solution of a composition for forming a protective film was prepared.

Comparative Example 6

A reaction flask, in which 67.55 g of propylene glycol monomethyl ether was added to 10.00 g of resorcinol diglycidyl ether (Product Name: DENACOL EX-201-IM, manufactured by Nagase ChemteX Corporation), 6.09 g of a succinic acid, and 0.80 g of ethyl triphenyl phosphonium bromide, was heated and stirred at 100° C. for 27 hours in a nitrogen atmosphere. The reaction product corresponded to formula (E-6), and the weight average molecular weight Mw determined by GPC in terms of polystyrene was 3,000.

[Chemical Formula 32]

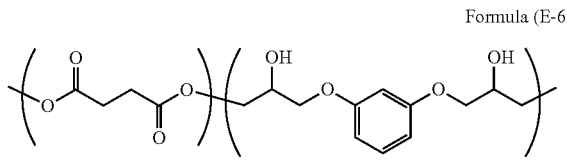

Formula (E-6)

3.93 g of a solution of the reaction product (a solid content of 16.7% by weight) corresponding to formula (E-6) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.94 g of propylene glycol monomethyl ether, and 1.92 g of propylene glycol monomethyl ether acetate were added, and thus, a solution of a composition for forming a protective film was prepared.

Comparative Example 7

A solution of 5.00 g of glycidyl methacrylate, 5.21 g of 5-vinyl benzo[d][1,3]dioxole (manufactured by Cool Pharm LTD.), 0.58 g of 2,2'-azobis(isobutyronitrile), and 34.53 g of propylene glycol monomethyl ether was added to a dropping funnel, and was dropped into a reaction flask, to which 8.63 g of propylene glycol monomethyl ether had been added at 100° C. in a nitrogen atmosphere, and the reaction flask was heated and stirred for 20 hours. The reaction product corresponded to formula (E-7), and the weight average molecular weight Mw determined by GPC in terms of polystyrene was 9,000.

[Chemical Formula 33]

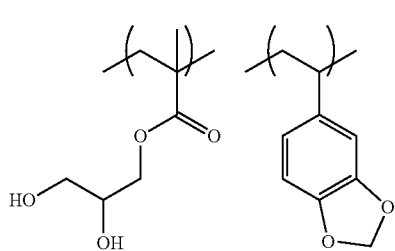

Formula (E-7)

4.06 g of a solution of the reaction product (a solid content of 16.1% by weight) corresponding to formula (E-7) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 13.87 g of propylene glycol monomethyl ether, 1.92 g of propylene glycol monomethyl ether acetate were added, and thus, a solution of a composition for forming a protective film was prepared.

Comparative Example 8

A solution of 16.00 g of glycidyl methacrylate, 4.53 g of 2,2'-azobis(isobutyronitrile), and 65.68 g of propylene glycol monomethyl ether was added to a dropping funnel, and was dropped into a reaction flask, to which 16.48 g of propylene glycol monomethyl ether had been added at 100° C. in a nitrogen atmosphere, and the reaction flask was heated and stirred for 13 hours. 5.31 g of 3,4-dihydroxy benzoic acid, 0.20 g of benzyl triethyl ammonium chloride, and 17.89 g of propylene glycol monomethyl ether were added to 30.00 g of the obtained solution (an epoxy value of 676 g/eq), and the resultant solution was heated and stirred to reflux for 20 hours in a nitrogen atmosphere. The reaction product corresponded to formula (E-8), and the weight average molecular weight Mw determined by GPC in terms of polystyrene was 24,400.

[Chemical Formula 34]

Formula (E-8)

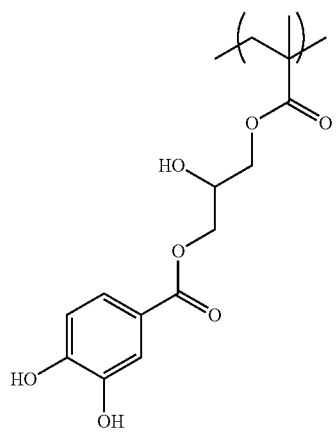

3.36 g of a solution of the reaction product (a solid content of 19.5% by weight) corresponding to formula (E-8) above, 0.13 g of 3,3',5,5'-tetrakis(methoxymethyl)-4,4'-dihydroxy biphenyl (Product Name: TMOM-BP, manufactured by Honshu Chemical Industry Co., Ltd.) as a cross-linking agent, 0.01 g of pyridinium-4-hydroxybenzene sulfonate as a cross-linking catalyst, 0.001 g of a fluorine-based surfactant (Product Name: MEGAFACE R-40, manufactured by DIC Corporation) as a surfactant, 14.58 g of propylene glycol monomethyl ether, and 1.92 g of propylene glycol monomethyl ether acetate were added, and thus, a solution of a composition for forming a protective film was prepared.

[Resist Solvent Resistance Test]

Each of the compositions for forming a protective film, prepared in Example 1 to Example 8 and Comparative Example 1 to Comparative Example 8, was applied onto a silicon wafer by a spin coater (spin coat). The silicon wafer after being coated with the composition was heated on a hot plate at 250° C. for 1 minute, and thus, a film (a protective film) having a film thickness of 100 nm was formed. Next, in order to check resist solvent resistance of the protective film, the silicon wafer after the protective film was formed was dipped in a solvent in which propylene glycol monomethyl ether and propylene glycol monomethyl ether acetate were mixed at a weight ratio of 7:3 for 1 minute, and was baked at 100° C. for 30 seconds after spin dry. The film thickness of the protective film before and after being dipped in the mixed solvent was measured by an optical interference film thickness meter (Product Name: NanoSpec 6100, manufactured by Nanometrics Japan Ltd.).

The resist solvent resistance was evaluated by calculating a film thickness decrease rate (%) of the protective film removed by being dipped in the solvent, from a calculus equation of ((Film Thickness before Being Dipped in Solvent)−(Film Thickness after Being Dipped in Solvent))÷(Film Thickness before Being Dipped in Solvent)×100. The results are shown in Table 1. Note that, in a case where the film thickness decrease rate is less than or equal to approximately 1%, it can be said that the resist solvent resistance is sufficient.

TABLE 1

| Example | Film thickness decrease rate |
|---|---|
| Example 1 | 0.0% |
| Example 2 | 0.0% |
| Example 3 | 0.2% |
| Example 4 | 0.0% |
| Example 5 | −0.4% |
| Example 6 | −0.1% |
| Example 7 | 0.0% |
| Example 8 | 0.1% |
| Comparative Example 1 | 0.2% |
| Comparative Example 2 | 0.2% |
| Comparative Example 3 | 0.0% |
| Comparative Example 4 | 0.0% |
| Comparative Example 5 | 0.1% |
| Comparative Example 6 | 0.1% |
| Comparative Example 7 | 0.0% |
| Comparative Example 8 | 0.0% |

From the results reported above, it was found that in the compositions for forming a protective film of Example 1 to Example 8 and Comparative Examples 1 to 8, a film thickness change was extremely small even after being dipped in the resist solvent. Accordingly, the compositions for forming a protective film of Example 1 to Example 8 have the resist solvent resistance sufficient to function as the protective film.

[Resistance Test Against Basic Hydrogen Peroxide Solution]

In order to evaluate the resistance against basic hydrogen peroxide solution, each of the compositions for forming a protective film, prepared in Example 1 to Example 8 and Comparative Example 1 to Comparative Example 8, was applied onto a titanium nitride (TiN) vapor-deposited substrate having a film thickness of 50 nm, and was heated at 250° C. for 1 minute, and thus, a protective film was formed such that a film thickness was 100 nm. Next, 28% aqueous ammonia, 33% hydrogen peroxide, and water were mixed at a weight ratio of 1:1:2, and thus, a basic hydrogen peroxide solution was prepared. The TiN vapor-deposited substrate coated with the composition for forming a protective film was dipped in the basic hydrogen peroxide solution heated to 50° C., the time until the protective film was peeled off from the substrate immediately after being dipped in the basic hydrogen peroxide solution (a peeling time) was measured. The results of a resistance test against the basic hydrogen peroxide solution are shown in Table 2. Note that, it can be said that resistance against a wet etching liquid using the basic hydrogen peroxide solution is high as the peeling time increases.

[Resistance Test against Acidic Hydrogen Peroxide Water]

As resistance evaluation against acidic hydrogen peroxide solution, each of the compositions for forming a protective film, prepared in Example 1 to Example 8 and Comparative Example 1 to Comparative Example 8, was applied onto a TiN vapor-deposited substrate having a film thickness of 50 nm, and was heated at 250° C. for 1 minute, and thus, a protective film was formed such that a film thickness was 100 nm. Next, a phosphoric acid of 85% and 33% hydrogen peroxide were mixed at a weight ratio of 1:1, and thus, acidic hydrogen peroxide solution was prepared. The TiN vapor-deposited substrate coated with the composition for forming a protective film was dipped in the acidic hydrogen peroxide solution heated to 60° C., a time until the protective film was peeled off from the substrate immediately after being dipped in the acidic hydrogen peroxide solution (a peeling time) was measured. Results of a resistance test against the acidic hydrogen peroxide solution are shown in Table 2. Note that, it can be said that the longer the peeling time, the higher the resistance against a wet etching liquid using the acidic hydrogen peroxide solution.

TABLE 2

| Example | Peeling time of protective film (basic hydrogen peroxide water) | Peeling time of protective film (acidic hydrogen peroxide water) |
|---|---|---|
| Example 1 | 106 seconds | — |
| Comparative Example 1 | 41 seconds | — |
| Example 2 | 135 seconds | 10 minutes or longer |
| Comparative Example 2 | 92 seconds | 5 to 10 minutes |
| Example 3 | 107 seconds | — |
| Comparative Example 3 | 51 seconds | — |
| Example 4 | 87 seconds | 10 minutes or longer |
| Comparative Example 4 | 58 seconds | 5 to 10 minutes |
| Example 5 | 93 seconds | — |
| Comparative Example 5 | 57 seconds | — |
| Example 6 | 236 seconds | — |
| Comparative Example 6 | 139 seconds | — |
| Example 7 | 169 seconds | 5 minutes or shorter |
| Example 8 | 144 seconds | 5 to 10 minutes |
| Comparative Example 7 | 291 seconds | 10 minutes or longer |
| Comparative Example 8 | 600 seconds or longer | 10 minutes or longer |

From the results reported above, comparison of Example 1 using a polymer having a structure containing at a terminal thereof at least one pair of two hydroxy groups adjacent to each other in the molecule with Comparative Example 1 not using such a polymer revealed that the peeling time of the protective film against the basic hydrogen peroxide solution was longer in Example 1 than in Comparative Example 1. Similarly, comparisons of Example 2 with Comparative Example 2, Example 3 with Comparative Example 3, Example 4 with Comparative Example 4, Example 5 with Comparative Example 5, and Example 6 with Comparative Example 6 revealed that the peeling time of the protective film against the basic hydrogen peroxide solution or the acidic hydrogen peroxide solution was longer in each of the examples than in each of the comparative examples.

That is, from the results of Example 1 to Example 6, selecting and adopting the polymer having a structure containing at a terminal thereof at least one pair of two hydroxy groups adjacent to each other in the molecule permit achieving excellent resistance against the wet etching liquid using a basic hydrogen peroxide solution, an acidic hydrogen peroxide solution, or both thereof, as compared to Comparative Example 1 to Comparative Example 6, in which such a polymer was not selected nor adopted.

In addition, it can be said that Example 7 and Example 8 exhibit excellent resistance against the wet etching liquid using a basic hydrogen peroxide solution, an acidic hydrogen peroxide solution, or both thereof, as compared to Comparative Example 1 to Comparative Example 6. Therefore, Example 1 to Example 8 exhibit excellent chemical solution resistance against the wet etching liquid using a basic hydrogen peroxide solution, an acidic hydrogen peroxide solution, or both thereof, and thus, they are useful as a protective film against the wet etching liquid for a semiconductor, as compared to Comparative Examples 1 to 6.

[Evaluation of Etching Selectivity]

In order to evaluate the etching selectivity, each of the compositions for forming a protective film, prepared in Example 1 to Example 8 and Comparative Example 7 to Comparative Example 8 above, was applied onto a silicon wafer, and was heated at 250° C. for 1 minute, and thus, a protective film was formed so as to have a film thickness of 100 nm. Next, the formed protective film and a resist underlayer film for semiconductor photolithography (Product Name: ARC (registered trademark) 29A, manufactured by Nissan Chemical Corporation) were subjected to dry etching by nitrogen gas using a dry etching device (Product Name: RIE-10NR, manufactured by Samco Inc.), and thus, the ratio of dry etching rate of the protective film (selectivity of the dry etching rate) was measured. The results of measurement of etching selectivity are shown in Table 3. Note that, it can be said that the higher the etching selectivity, the higher the dry etching rate.

[Flattening Property Test on Pattern Substrate]

In order to perform the flattening property test on a pattern substrate, each of the compositions for forming a protective film, prepared in Example 1 to Example 8 and Comparative Example 7 to Comparative Example 8, was applied onto a TiN vapor-deposited silicon substrate having a film thickness of 5 nm, a depth of 200 nm, and a trench width of 50 nm, and was heated at 250° C. for 1 minute. When the composition for forming a protective film was heated on a silicon wafer at 250° C. for 1 minute, a protective film was prepared so as to have a film thickness of 100 nm. The protective film was formed on a patterned substrate, and then, the film thickness in a dense pattern area having a pitch of 100 nm and an open area in which a pattern was not formed was observed by using a scanning electron microscope (Product Name: S-4800, manufactured by Hitachi High-Tech Corporation), and the difference in film thickness between the dense area and the open area (the film thickness bias) was measured. The results of measurement of the film thickness bias are shown in Table 3. Note that, it can be said that the smaller the film thickness bias, the smaller the film thickness difference between the dense area and the open area, and thus, a highly flat coating can be performed on a base substrate having a pattern.

TABLE 3

| Example | Etching selectivity (ARC (registered trademark) 29A ratio) | Film thickness bias (dense/open) |
|---|---|---|
| Example 1 | 1.40 | 8 nm |
| Example 2 | 0.97 | 8 nm |
| Example 3 | 1.01 | 32 nm |
| Example 4 | 0.99 | 20 nm |
| Example 5 | 0.92 | 22 nm |
| Example 6 | 0.91 | 54 nm |
| Example 7 | 0.95 | 56 nm |
| Example 8 | 0.98 | 30 nm |
| Comparative Example 7 | 0.65 | 81 nm |
| Comparative Example 8 | 0.78 | 81 nm |

From the results reported above, it can be said that Example 1 to Example 8 have a higher dry etching selectivity, and thus, have a higher dry etching rate, as compared to Comparative Example 7 and Comparative Example 8. That is, Example 1 to Example 8 are useful, because the dry etching time required for removing the protective film can be reduced, and thus, a damage against the base substrate can be reduced.

In addition, it can be said that Example 1 to Example 8 have a smaller difference in film thickness (film thickness bias) between the dense area and the open area, and are capable of forming a film on the base substrate having a pattern to be flat, as compared to Comparative Example 7 and Comparative Example 8. That is, Example 1 to Example 8 are useful, because the film thickness is less likely to be inhomogeneous on the base substrate having a pattern, and a constant amount of protective film can be homogeneously removed within a desired etching time.

That is, Example 1 to Example 8 are excellent in the resistance against the wet etching liquid for a semiconductor using the basic hydrogen peroxide solution, the acidic hydrogen peroxide solution, or both thereof, as compared to Comparative Example 1 to Comparative Example 6, have a higher etching rate, as compared to Comparative Examples 7 and 8, and are capable of performing the coating on the base substrate having a pattern to be flat. Accordingly, according to the present invention, it is possible to provide a composition for forming a protective film, having high wet etching liquid resistance, a high etching rate, and high flattening properties together.

INDUSTRIAL APPLICABILITY

The composition for forming a protective film according to the present invention is excellent in resistance at the time of applying a wet etching liquid to substrate processing and has a high dry etching rate, and thus, facilitates the substrate processing and provides a protective film excellent in flattening properties in the case of being applied onto a stepped substrate.

The invention claimed is:

1. A composition for forming a protective film against a wet etching liquid for a semiconductor, comprising:
a polymer having at a terminal thereof a 1,2-ethanediol structure (A); and
an organic solvent;
wherein the 1,2-ethanediol structure is represented by formula (I):

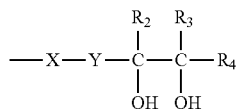

Formula (1)

where:
X is —S—;
Y represents a direct bond or an alkylene group having 1 to 4 carbon atoms which may be substituted;
$R_2$, $R_3$, and $R_4$ each are a hydrogen atom, an alkyl group having 1 to 10 carbon atoms which may be substituted, or an aryl group having 6 to 40 carbon atoms which may be substituted; and
$R_2$ may form a ring together with $R_3$ or $R_4$; and
wherein the polymer is a reaction product of a diepoxy compound (B) and a bi- or higher-functional proton generating compound (C) wherein the bi- or higher functional proton generating compound (C) is an acid anhydride.

2. A composition for forming a protective film against a wet etching liquid for a semiconductor, comprising:
a polymer having at a terminal thereof a 1,2-ethanediol structure (A); and
an organic solvent;
wherein the 1,2-ethanediol structure includes a structure represented by formula (1):

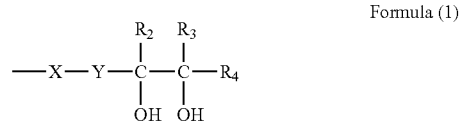

where:
X represents any of —COO—, —OCO—, —O—, —S—, and —$NR_1$—;
$R_1$ represents a hydrogen atom or a methyl group;
Y represents a direct bond or an alkylene group having 1 to 4 carbon atoms which may be substituted; and
$R_2$, $R_3$, and $R_4$ are a hydrogen atom; and
wherein the polymer is a reaction product of a diepoxy compound (B) and a bi- or higher-functional proton generating compound (C) wherein the bi- or higher functional proton generating compound (C) is an acid anhydride.

3. The composition for forming a protective film according to claim 1, wherein in formula (1), Y is a methylene group.

4. The composition for forming a protective film according to claim 2, wherein in formula (1), X is —S—.

5. The composition for forming a protective film according to claim 1, wherein the polymer has a partial structure represented by formula (2) below:

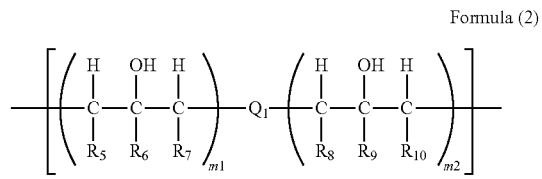

where:
$R_5$, $R_6$, $R_7$, $R_8$, $R_9$, and $R_{10}$ each independently represent a hydrogen atom, a methyl group, or an ethyl group;
$Q_1$ represents a divalent organic group between two carbon atoms; and
m1 and m2 each independently represent 0 or 1.

6. The composition for forming a protective film according to claim 5, wherein in formula (2) above, $Q_1$ is represented by formula (3) below:

—$Z_1$-$Q_2$-$Z_2$—  Formula (3)

where:
Q2 represents a direct bond, an alkylene group having 1 to 10 carbon atoms which may be interrupted with —O—, —S—, or —S—S—, an alkenylene group having 2 to 6 carbon atoms which may be interrupted with —O—, —S—, or —S—S—, or a divalent organic group having at least one of an alicyclic hydrocarbon ring having 3 to 10 carbon atoms and an aromatic hydrocarbon ring having 6 to 14 carbon atoms,
the divalent organic group may be substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxy carbonyl group having 1 to 6 carbon atoms, and an alkylthio group having 1 to 6 carbon atoms, and $Z_1$ and $Z_2$ each represent any of —COO—, —OCO—, —O—, and —S—.

7. The composition for forming a protective film according to claim 5, wherein in formula (2) above, Q1 is represented by formula (4) below:

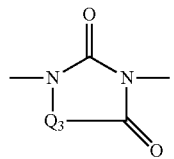

Formula (4)

where $Q_3$ represents formula (5), formula (6), or formula (7) below:

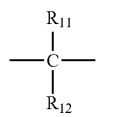

Formula (5)

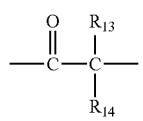

Formula (6)

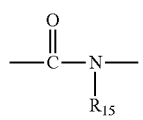

Formula (7)

where:
$R_{11}$, $R_{12}$, $R_{13}$, $R_{14}$, and $R_{15}$ each independently represent a hydrogen atom, an alkyl group having 1 to 6 carbon atoms, an alkenyl group having 3 to 6 carbon atoms, a benzyl group, or a phenyl group,
the phenyl group may be substituted with at least one member selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms, and
$R_{13}$ and $R_{14}$ may be bonded to each other to form a ring having 3 to 6 carbon atoms.

8. The composition for forming a protective film according to claim 1, further comprising a cross-linking catalyst.

9. The composition for forming a protective film according to claim 1, further comprising a cross-linking agent.

10. The composition for forming a protective film according to claim 1, further comprising a surfactant.

11. A protective film, which is a calcined product of a coating film from the composition for forming a protective film according to claim 1.

12. A method for producing a resist-patterned substrate for use in manufacturing of a semiconductor, comprising the steps of:
applying the composition for forming a protective film according to claim 1 onto a semiconductor substrate and baking the applied composition to form a protective film as a resist underlayer film;
forming a resist film on the protective film; and then,
subjecting the semiconductor substrate to exposure and development to form a resist pattern.

13. A method for manufacturing a semiconductor device, comprising the steps of:
forming a protective film on a semiconductor substrate, which may have an inorganic film formed on a surface thereof, with the composition for forming a protective film according to claim 1;
forming a resist pattern on the protective film;
dry etching the protective film through the resist pattern as a mask so as to expose the inorganic film or a surface of the semiconductor substrate;
wet etching the inorganic film or the semiconductor substrate with a wet etching liquid for a semiconductor through the dry-etched protective film as a mask and washing the wet-etched inorganic film or the semiconductor substrate.

14. The composition for forming a protective film according to claim 2, wherein in formula (1), Y is a methylene group.

15. The composition for forming a protective film according to claim 2, wherein the polymer has a partial structure represented by formula (2) below:

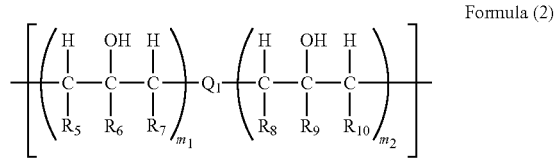

Formula (2)

where:
$R_5$, $R_6$, $R_7$, $R_8$, $R_9$, and $R_{10}$ each independently represent a hydrogen atom, a methyl group, or an ethyl group;
$Q_1$ represents a divalent organic group between two carbon atoms; and
m1 and m2 each independently represent 0 or 1.

16. The composition for forming a protective film according to claim 2, further comprising a cross-linking catalyst.

17. The composition for forming a protective film according to claim 2, further comprising a cross-linking agent.

18. The composition for forming a protective film according to claim 2, further comprising a surfactant.

19. A protective film, which is a calcined product of a coating film from the composition for forming a protective film according to claim 2.

20. A method for producing a resist-patterned substrate for use in manufacturing of a semiconductor, comprising the steps of:
applying the composition for forming a protective film according to claim 2 onto a semiconductor substrate and baking the applied composition to form a protective film as a resist underlayer film;
forming a resist film on the protective film; and then,
subjecting the semiconductor substrate to exposure and development to form a resist pattern.

21. A method for manufacturing a semiconductor device, comprising the steps of:
forming a protective film on a semiconductor substrate, which may have an inorganic film formed on a surface thereof, with the composition for forming a protective film according to claim 2;

forming a resist pattern on the protective film;
dry etching the protective film through the resist pattern as a mask so as to expose the inorganic film or a surface of the semiconductor substrate;
wet etching the inorganic film or the semiconductor substrate with a wet etching liquid for a semiconductor through the dry-etched protective film as a mask and washing the wet-etched inorganic film or the semiconductor substrate.

* * * * *